US008951878B2

(12) United States Patent
Jinbo et al.

(10) Patent No.: US 8,951,878 B2
(45) Date of Patent: Feb. 10, 2015

(54) METHOD FOR MANUFACTURING SOI SUBSTRATE AND SEMICONDUCTOR DEVICE

(71) Applicant: Semiconductor Energy Laboratory Co., Ltd., Atsugi-shi, Kanagawa-ken (JP)

(72) Inventors: Yasuhiro Jinbo, Atsugi (JP); Hironobu Shoji, Tochigi (JP); Hideto Ohnuma, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/097,793

(22) Filed: Dec. 5, 2013

(65) Prior Publication Data

US 2014/0087543 A1    Mar. 27, 2014

Related U.S. Application Data

(62) Division of application No. 13/759,264, filed on Feb. 5, 2013, now Pat. No. 8,629,031, which is a division of application No. 12/722,684, filed on Mar. 12, 2010, now Pat. No. 8,399,329, which is a division of application No. 12/076,763, filed on Mar. 21, 2008, now Pat. No. 7,709,337.

(30) Foreign Application Priority Data

Apr. 20, 2007    (JP) .................... 2007-112239

(51) Int. Cl.
*H01L 21/331*    (2006.01)
*H01L 21/8222*    (2006.01)
(Continued)

(52) U.S. Cl.
CPC .......... *H01L 21/84* (2013.01); *H01L 21/26506* (2013.01); *H01L 21/76254* (2013.01)
USPC ........... 438/311; 438/308; 438/680; 438/692; 257/E21.17; 257/E21.134; 257/E21.135; 257/E21.278; 257/E21.293; 257/E21.304

(58) Field of Classification Search
USPC ......... 438/311, 308, 680, 692, 474, 475, 505, 438/506, 508, 509, 510, 513; 257/E21.17, 257/E21.134, E21.135, E21.278, E21.293, 257/E21.304
See application file for complete search history.

(56) References Cited

U.S. PATENT DOCUMENTS 5,670,411 A    9/1997    Yonehara et al.
6,020,252 A    2/2000    Aspar et al.
(Continued)

FOREIGN PATENT DOCUMENTS

EP    0628339 A    12/1994
EP    0 807 970    11/1997
(Continued)

OTHER PUBLICATIONS

International Search Report (Application No. PCT/JP2008/055174) dated Jun. 24, 2008.
(Continued)

*Primary Examiner* — David Nhu
(74) *Attorney, Agent, or Firm* — Eric J. Robinson; Robinson Intellectual Property Law Office, P.C.

(57) ABSTRACT

It is an object of the present invention to provide a method for manufacturing an SOI substrate having an SOI layer that can be used in practical applications with high yield even when a flexible substrate such as a glass substrate or a plastic substrate is used. Further, it is another object of the present invention to provide a method for manufacturing a thin semiconductor device using such an SOI substrate with high yield. When a single-crystal semiconductor substrate is bonded to a flexible substrate having an insulating surface and the single-crystal semiconductor substrate is separated to manufacture an SOI substrate, one or both of bonding surfaces are activated, and then the flexible substrate having an insulating surface and the single-crystal semiconductor substrate are attached to each other.

15 Claims, 25 Drawing Sheets

(51) Int. Cl.
*H01L 21/84* (2006.01)
*H01L 21/265* (2006.01)
*H01L 21/762* (2006.01)

(56) References Cited

U.S. PATENT DOCUMENTS

| | | | |
|---|---|---|---|
| 6,225,192 B1 | 5/2001 | Aspar et al. |
| 6,372,609 B1 | 4/2002 | Aga et al. |
| 6,380,046 B1 | 4/2002 | Yamazaki |
| 6,468,923 B1 | 10/2002 | Yonehara et al. |
| 6,583,440 B2 | 6/2003 | Yasukawa |
| 6,700,631 B1 | 3/2004 | Inoue et al. |
| 6,809,009 B2 | 10/2004 | Aspar et al. |
| 6,818,921 B2 | 11/2004 | Yasukawa |
| 6,885,389 B2 | 4/2005 | Inoue et al. |
| 7,029,950 B2 | 4/2006 | Yonehara et al. |
| 7,067,396 B2 | 6/2006 | Aspar et al. |
| 7,112,514 B2 | 9/2006 | Yasukawa |
| 7,157,352 B2 | 1/2007 | Yamanaka |
| 7,199,024 B2 | 4/2007 | Yamazaki |
| 7,262,088 B2 | 8/2007 | Kodaira et al. |
| 7,276,429 B2 | 10/2007 | Yamanaka |
| 7,439,111 B2 | 10/2008 | Ohtani et al. |
| 7,456,059 B2 | 11/2008 | Kodaira et al. |
| 7,498,234 B2 | 3/2009 | Aspar et al. |
| 7,508,034 B2 | 3/2009 | Takafuji et al. |
| 7,521,335 B2 | 4/2009 | Yamanaka |
| 7,709,337 B2 * | 5/2010 | Jinbo et al. .................. 438/311 |
| 8,399,329 B2 * | 3/2013 | Jinbo et al. .................. 438/311 |
| 8,629,031 B2 * | 1/2014 | Jinbo et al. .................. 438/311 |
| 2001/0007789 A1 | 7/2001 | Aspar et al. |
| 2002/0100941 A1 | 8/2002 | Yonehara et al. |
| 2005/0202619 A1 | 9/2005 | Kodaira et al. |
| 2009/0095956 A1 | 4/2009 | Takafuji et al. |
| 2012/0012972 A1 | 1/2012 | Takafuji et al. |

FOREIGN PATENT DOCUMENTS

| | | |
|---|---|---|
| EP | 1 014 452 | 6/2000 |
| EP | 1 039 513 | 9/2000 |
| EP | 1 229 582 | 8/2002 |
| EP | 1 575 085 | 9/2005 |
| EP | 1 686 626 A | 8/2006 |
| JP | 08-255762 A | 10/1996 |
| JP | 11-087668 | 3/1999 |
| JP | 2000-012864 | 1/2000 |
| JP | 2000-077287 | 3/2000 |
| JP | 2000-331899 A | 11/2000 |
| JP | 2000-349266 A | 12/2000 |
| JP | 2002-170942 A | 6/2002 |
| JP | 2002-231909 | 8/2002 |
| JP | 2004-134672 A | 4/2004 |
| JP | 2004-134675 A | 4/2004 |
| JP | 2004-165679 A | 6/2004 |
| JP | 2004-179649 A | 6/2004 |
| JP | 2006-049800 | 2/2006 |
| JP | 2006-128638 A | 5/2006 |
| KR | 10-0448423 B | 9/2004 |
| TW | 457565 | 10/2001 |
| WO | WO 01/11667 | 2/2001 |

OTHER PUBLICATIONS

Written Opinion (Application No. PCT/JP2008/055174) dated Jun. 24, 2008.

Taiwanese Office Action (Application No. 97110074) Dated Feb. 14, 2014.

Korean Office Action (Application No. 2009-7022636) Dated Jan. 28, 2014.

* cited by examiner

FIG. 7A
FIG. 7B
FIG. 7C
FIG. 7D
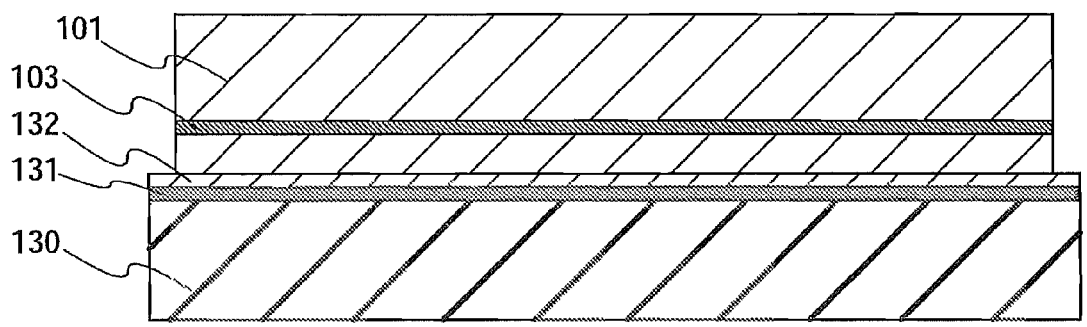
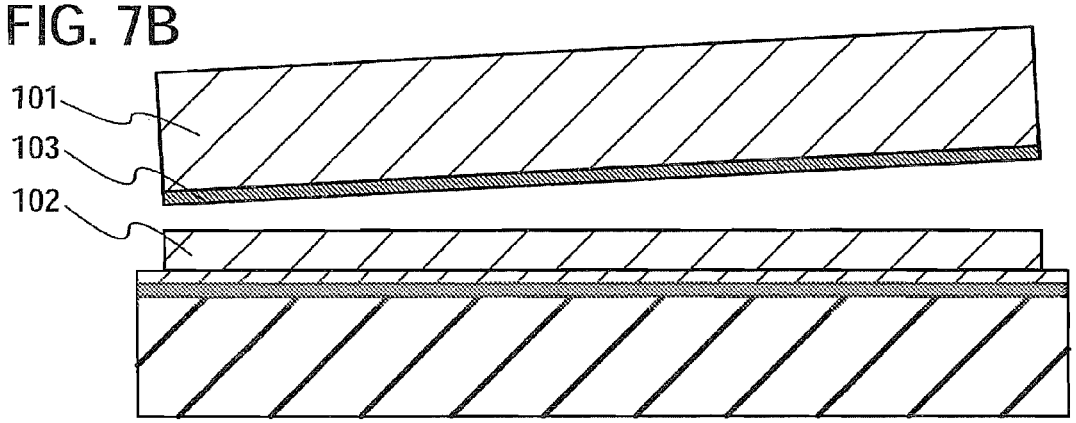
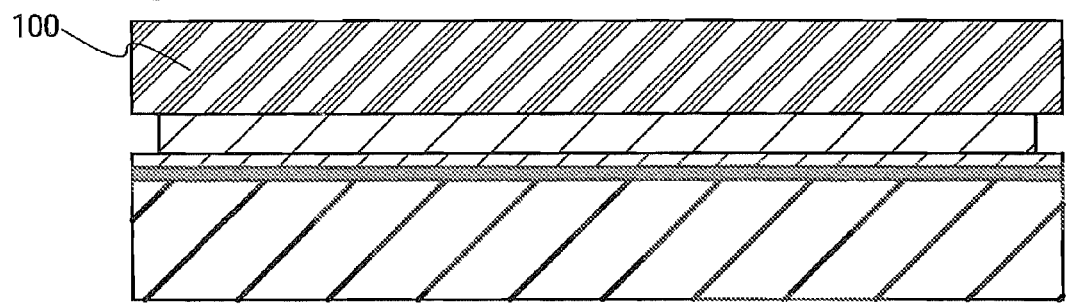
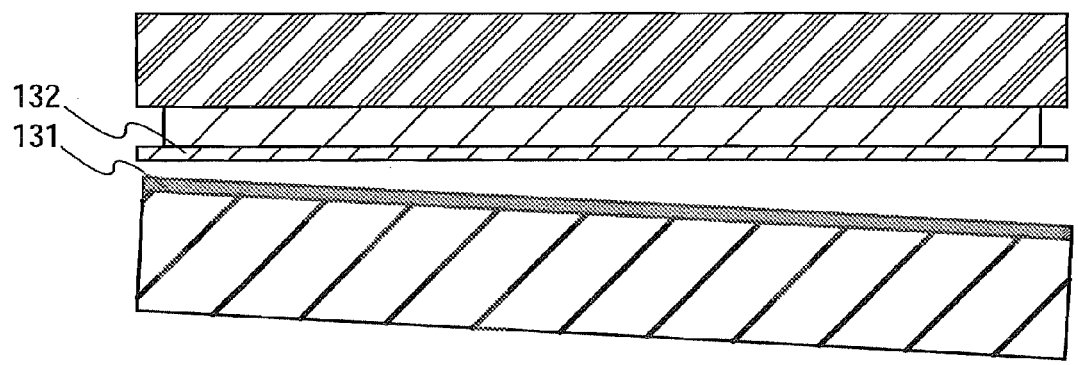

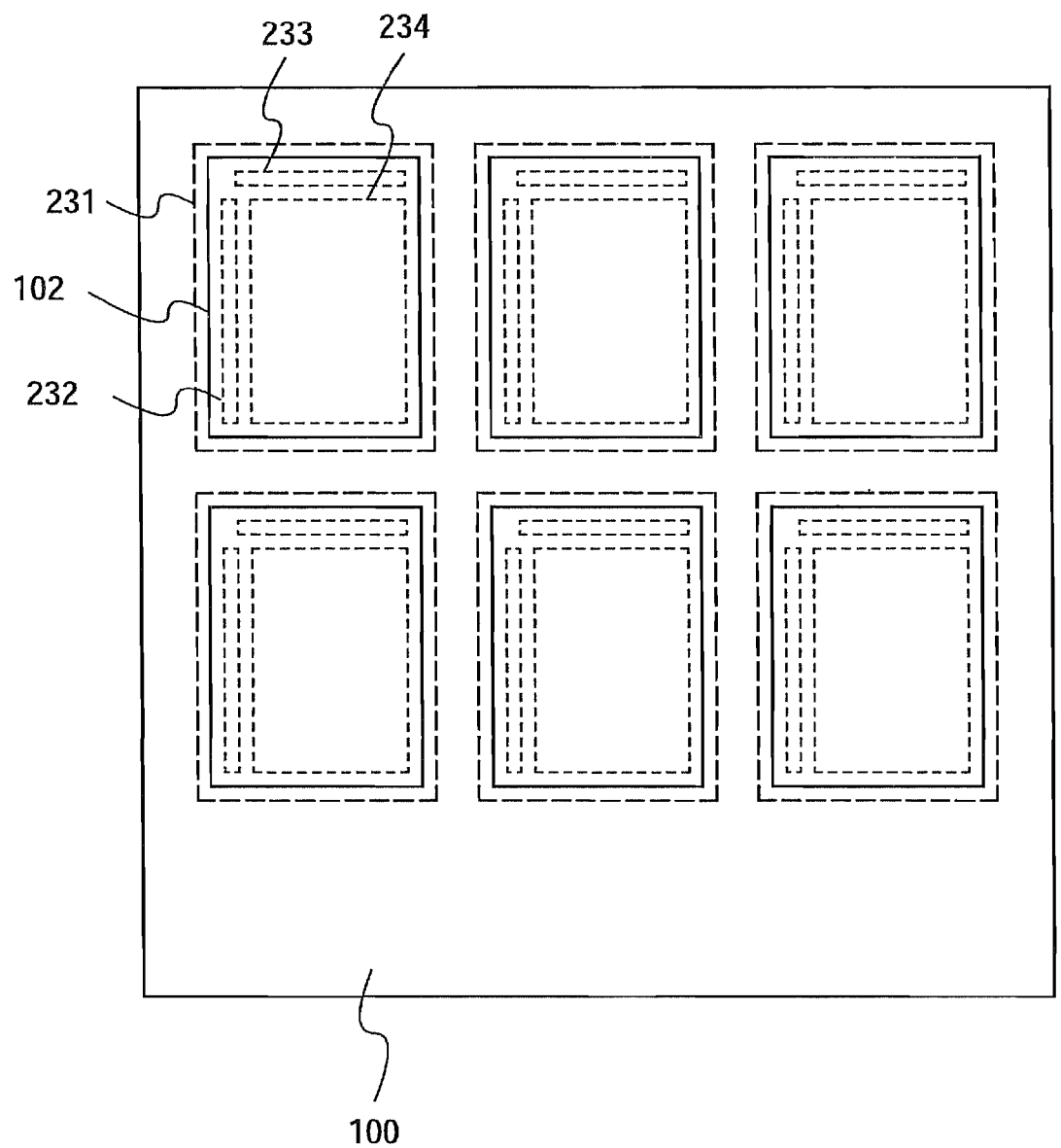

FIG.26

| Acceleration voltage | The ratio of the amount of H (X:Y) | The ratio of the number of H⁺ ions (X:Y/3) |
|---|---|---|
| 80 keV | 1:44.1 | 1:14.7 |
| 60 keV | 1:42.5 | 1:14.2 |
| 40 keV | 1:43.5 | 1:14.5 |

METHOD FOR MANUFACTURING SOI SUBSTRATE AND SEMICONDUCTOR DEVICE

This application is a Division of U.S. application Ser. No. 13/759,264 filed Feb. 5, 2013, now U.S. Pat. No. 8,629,031; which is a Division of U.S. application Ser. No. 12/722,684 filed Mar. 12, 2010, now U.S. Pat. No. 8,399,329; which is a Division of U.S. application Ser. No. 12/076,763 filed Mar. 21, 2008, now U.S. Pat. No. 7,709,337. This application also claims priority to Japanese Application Serial No. 2007-112239 filed Apr. 20, 2007.

TECHNICAL FIELD

The present invention relates to silicon-on-insulator (SOI) substrates, semiconductor devices manufactured using SOI substrates and manufacturing methods thereof. The present invention particularly relates to a bonding SOI technique and also relates to SOI substrates which are obtained by bonding a single-crystal or polycrystalline semiconductor layer to a flexible substrate having an insulating surface, semiconductor devices manufactured using SOI substrates and manufacturing methods thereof.

DESCRIPTION OF THE RELATED ART

Integrated circuits have been developed which use a single-crystal semiconductor substrate called a silicon-on-insulator (SOI) substrate that has a thin single-crystal semiconductor layer over an insulating surface, instead of a silicon wafer that is manufactured by thinly slicing an ingot of a single-crystal semiconductor. When transistors that are to be included in an integrated circuit are formed using an SOI substrate, parasitic capacitance between drains of the transistors and the substrate can be reduced and a semiconductor integrated circuit can be made to have higher performance. Therefore, SOI substrates have been attracting attention.

As a method for manufacturing SOI substrates, a hydrogen ion implantation separation method is known (for example, see Reference 1: U.S. Pat. No. 6,372,609). The hydrogen ion implantation separation method is a method in which hydrogen ions are implanted into a silicon wafer to form a microbubble layer at a predetermined depth from the surface, the surface into which hydrogen ions are implanted is superposed on another silicon wafer, heat treatment is performed to cause separation using the microbubble layer as a cleavage plane, and a thin silicon layer (SOI layer) is bonded to the other silicon wafer. In addition to the heat treatment for separation of the SOI layer, it is necessary to perform heat treatment in an oxidizing atmosphere to form an oxide layer on the SOI layer, remove the oxide layer, perform heat treatment at 1000° C. to 1300° C. in a reducing atmosphere to increase bonding strength, and recover a damaged layer on the surface of the SOI layer.

One of the known examples of semiconductor devices using SOI substrates is disclosed by the present applicant (see Reference 2: Japanese Published Patent Application No. 2000-12864). It is disclosed that heat treatment at 1050° C. to 1150° C. is necessary also in that case in order to eliminate trap levels and defects that are caused by stress in an SOI layer.

A conventional method for manufacturing an SOI substrate requires heat treatment at high temperatures of 1000° C. or higher in order to strengthen a bonding strength between an SOI substrate and an SOI layer and to recover a damaged layer on the surface of the SOI layer. Therefore, it has been impossible to form an SOI layer over a glass substrate which is used for manufacture of a liquid crystal panel, a substrate with an heatresistant temperature of about 700° C. or a plastic substrate with a lower heatresistant temperature. Even if an SOI layer is provided over a glass substrate by a hydrogen ion implantation separation method, there is a problem in that the bonding strength of the SOI layer is weak because high-temperature heat treatment for increasing bonding strength cannot be applied.

A flexible substrate is difficult to be fixed because the flexible substrate has a thin thickness and is easily bent and is difficult to handle; therefore, there is a problem in that a yield of a semiconductor device using the flexible substrate is low.

SUMMARY OF THE INVENTION

In view of the aforementioned problems, it is an object of the present invention to provide a method for manufacturing an SOI substrate having an SOI layer that can be used in practical applications with high yield even when a flexible substrate such as a glass substrate or a plastic substrate is used. Further, it is another object of the present invention to provide a method for manufacturing a thin semiconductor device using such an SOI substrate with high yield.

When a single-crystal semiconductor substrate is bonded to a flexible substrate having an insulating surface to manufacture an SOI substrate, one or both of bonding surfaces are activated, and then the flexible substrate having an insulating surface and the single-crystal semiconductor substrate are attached to each other. For example, at least one of the bonding surfaces of the flexible substrate having an insulating surface and the single-crystal semiconductor substrate is irradiated with an atomic beam or an ion beam. Alternatively, plasma irradiation or a radical treatment is performed. Further, at least one of the bonding surfaces of the flexible substrate having an insulating surface and the single-crystal semiconductor substrate may be subjected to treatment by oxygen plasma or washing with ozone water to be hydrophilic. By such surface treatment, even if temperatures of a heat treatment step is greater than or equal to 250° C. and less than 400° C., different kinds of materials can be easily bonded to each other.

In bonding a single-crystal semiconductor substrate to a flexible substrate having an insulating surface, a silicon oxide layer is formed using organic silane as a material on one or both of surfaces that are to form a bond. Examples of organic silane that can be used include silicon-containing compounds, such as tetraethoxysilane (TEOS), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane, and trisdimethylaminosilane. In other words, in an SOI substrate having a structure in which a single-crystal semiconductor layer (SOI layer) is bonded to a flexible substrate having an insulating surface, a silicon oxide layer which forms a smooth and activated surface is provided as a bonding surface on one or both of surfaces that are to form a bond.

The SOI layer that is to be bonded to the flexible substrate having an insulating surface is obtained by separation in a fragile region formed in the single-crystal semiconductor substrate. The fragile region is formed by irradiating the single-crystal semiconductor substrate with accelerated ions, which are generated by plasma excitation using a gas of hydrogen, helium, or a halogen typified by fluorine as a source gas. In this case, it is preferable to perform irradiation with a plurality of ions of a single atom that has different masses or a plurality of ions of a plurality of atoms that has different masses. In the case of irradiation with hydrogen ions, the hydrogen ions preferably include $H^+$, $H_2^+$, and $H_3^+$ ions with a high proportion of $H_3^+$ ions. In the case of irradiation with ionized helium, the single-crystal semiconductor substrate can be substantially doped with $He^+$ ions alone even by ion doping without mass separation. Note that the term "substantially" means that the single-crystal semiconductor substrate is also doped with a slight amount of ionized atmospheric elements.

In the SOI layer that is to be bonded to the flexible substrate having an insulating surface, the single-crystal semiconductor substrate is subjected to heat treatment to make the fragile region more fragile for separation in the fragile region formed in the single-crystal semiconductor substrate before bonding the single-crystal semiconductor substrate to the flexible substrate having an insulating surface. In this case, heat treatment is performed while pressure is applied to the surface of the single-crystal semiconductor substrate using a pressure member in order to prevent the ions which become a gas, from the fragile region. Alternatively, an insulating layer is formed on the single-crystal semiconductor substrate and heat treatment is performed.

Before bonding the single-crystal semiconductor layer separated from the single-crystal semiconductor substrate to the flexible substrate having an insulating surface, the single-crystal semiconductor substrate is irradiated with the accelerated ions and then heated to form the fragile region that is a region where a part of the single-crystal semiconductor substrate is made to be fragile, whereby the flexible substrate with low heat resistance and the single-crystal semiconductor substrate are bonded to each other and the SOI substrate can be manufactured. With this structure, even when a substrate with low heatresistant temperature such as a plastic substrate is used, the SOI substrate having the SOI layer which is bonded to the substrate by the bonding portion with high bonding strength can be obtained with high yield. Further, a semiconductor device using the SOI substrate can be manufactured.

BRIEF DESCRIPTION OF DRAWINGS

In the accompanying drawings:

FIGS. 7A to 7D are cross-sectional views explaining a method for manufacturing an SOI substrate;

FIG. 17 is a plane view exemplifying a case in which SOI layers is bonded to a mother glass used for manufacture of a display panel.

FIG. 26 is a list of ratios of fitting parameters (hydrogen atom ratios and hydrogen ion species ratios).

Hereinafter, embodiment modes and embodiments of the present invention are described using drawings. However, the present invention can be implemented with many different modes, and it is easily understood by those skilled in the art that the mode and details of the present invention can be changed variously unless such changes depart from the spirit and scope of the present invention. Thus, the present invention is construed without limiting to the description of the embodiment modes and embodiments included in this specification.

BEST MODE FOR CARRYING OUT THE INVENTION (Embodiment Mode 1)

Figure 1:
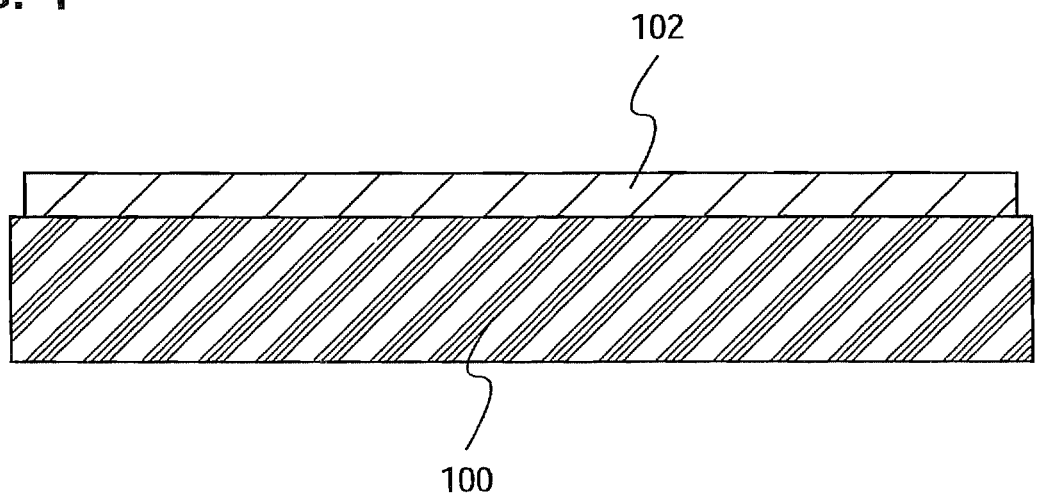
FIG. 1 is a cross-sectional view showing a structure of an SOI substrate.

FIG. 1 shows a structure of an SOI substrate according to the present invention. In FIG. 1, a base substrate 100 is a substrate which is provided with a SOI layer in the SOI substrate and which is flexible and has an insulating surface. As a typical example of the base substrate, a flexible insulating substrate, a flexible metal substrate provided with an insulating layer on the surface, or the like can be given. As the flexible insulating substrate, a plastic substrate formed of PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, or polyphthalamide, or the like, or paper made of a fibrous material can be given.

By using a prepreg for the flexible insulating substrate, damage caused by a point pressure or a linear pressure to the SOI substrate and a semiconductor device to be manufactured later can be prevented. A typical example of the prepreg can be obtained by impregnating a fiber body such as polyvinyl alcoholic fiber, polyester fiber, polyamide fiber, polyethylene fiber, aramid fiber, poly(p-phenylenebenzobisoxazole) fiber, glass fiber, carbon fiber or the like with a composition obtained by diluting a fluorine resin with an organic solvent, and then the matrix resin such as an epoxy resin, an unsaturated polyester resin, an polyimide resin, a fluorine resin or the like, is half-cured by volatilizing the organic solvent by drying.

Further, as the flexible insulating substrate, it is possible to use any of a variety of glass substrates that are used in the electronics industry such as aluminosilicate glass, aluminoborosilicate glass and barium borosilicate glass.

As the flexible metal substrate provided with an insulating layer on the surface, a metal film, a metal sheet on which an insulating layer such as a silicon oxide layer, a silicon nitride layer, a silicon oxynitride layer, an aluminum nitride layer, or an aluminum oxide layer is formed, or the like can be given. Note that the insulating layer is not limited to the above-described insulating layers, and the other insulating layers can be used as appropriate.

An SOI layer 102 is a single-crystal semiconductor layer, and single-crystal silicon is typically used. Alternatively, silicon which can be separated from a polycrystalline semiconductor substrate by a hydrogen ion implantation separation method or germanium which can be separated from a single-crystal semiconductor substrate or a polycrystalline semiconductor substrate by a hydrogen ion implantation separation method can be used. Still alternatively, a crystalline semiconductor substrate of a compound semiconductor such as silicon germanium, gallium arsenide, or indium phosphide can be used.

Note that, in this embodiment mode and in the embodiment modes described after this embodiment, as a typical example of the SOI layer 102, the single-crystal semiconductor layer is used. When the polycrystalline semiconductor substrate is used instead of the single-crystal semiconductor substrate, the SOI layer 102 is replaced with a polycrystalline semiconductor layer. When the crystalline semiconductor substrate is used instead of the single-crystal semiconductor substrate, the SOI layer 102 is replaced with a crystalline semiconductor layer.

Figure 2:
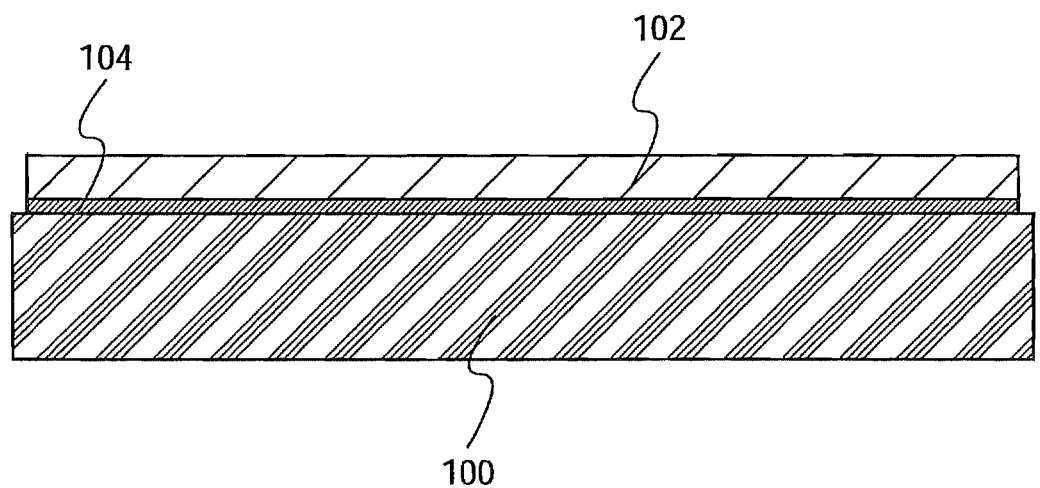
FIG. 2 is a cross-sectional view showing a structure of an SOI substrate.

As shown in FIG. 2, a bonding layer (a layer formed at a bonding interface) 104 having a smooth and activated surface may be provided between the base substrate 100 and the SOI layer 102. The SOI substrate shown in FIG. 2 is manufactured by forming the bonding layer 104 having a smooth and activated surface on a surface of the SOI layer 102 and bonding the bonding layer 104 having a smooth and activated surface to the base substrate 100. Note that the SOI substrate may be manufactured by forming the bonding layer 104 having a smooth and activated surface on a surface of the base substrate 100 and bonding the bonding layer 104 having a smooth and activated surface to the SOI layer 102.

A silicon oxide layer is suitable for the bonding layer 104. In particular, a silicon oxide layer formed by a chemical vapor deposition method using an organic silane gas is preferable. As an organic silane gas, a silicon-containing compound such as tetraethoxysilane, tetramethylsilane, tetramethylcyclotetrasiloxane, octamethylcyclotetrasiloxane, hexamethyldisilazane, triethoxysilane or trisdimethylaminosilane can be used. A thermal oxide layer formed by subjecting the single-crystal semiconductor substrate to heat treatment at high temperature or chemical oxide can also be used for the bonding layer 104. For example, chemical oxide can be formed by treating a surface of the single-crystal semiconductor substrate which is to be the SOI layer with an ozone-containing aqueous solution. Chemical oxide is formed reflecting flatness of the surface of the single-crystal semiconductor substrate, which is preferable.

The bonding layer 104 having a smooth surface which is activated is provided at a thickness of 1 nm to 600 nm, preferably 5 nm to 500 nm, more preferably 5 nm to 200 nm. With such a thickness, it is possible to smooth surface roughness of a surface on which a bond is to be formed (a surface that is to form a bond) and also to ensure smoothness of a growing surface of the layer. In addition, providing the bonding layer 104 makes it possible to mitigate thermal distortion of the base substrate and the SOI layer that are to be bonded together. In bonding the SOI layer 102 to the base substrate 100 that is a flexible substrate having an insulating surface, the base substrate 100 and the SOI layer 102 can be strongly bonded together by provision of the bonding layer 104 made of a silicon oxide layer, preferably a thermal oxide layer, a silicon oxide layer formed by treating a surface of the single-crystal semiconductor substrate with ozone water, or a silicon oxide layer formed using organic silane as a material over one or both of bonding surfaces of the base substrate 100 and the SOI layer 102.

FIG. 3A to FIG. 4B show a structure in which at least a barrier layer 105 and the bonding layer 104 are provided between the base substrate 100 and the SOI layer 102. When the SOI layer 102 is bonded to the base substrate 100, by provision of the barrier layer 105, the SOI layer 102 can be prevented from being contaminated by impurities such as movable ions of an alkaline metal, an alkaline earth metal, or the like that are diffused from a flexible insulating substrate, a flexible metal substrate and a flexible substrate having an insulating surface that are used as the base substrate 100. As the barrier layer 105, a nitrogen-containing insulating layer is preferably used. Typically, the barrier layer 105 is formed by stacking one or more of a silicon nitride layer, a silicon nitride oxide layer, a silicon oxynitride layer, an aluminum nitride layer, an aluminum nitride oxide layer, or an aluminum oxynitride layer. A barrier layer 120 can be formed, for example, by stacking a silicon oxynitride layer and a silicon nitride oxide layer from the SOI layer 102 side. As the barrier layer 105, a dense layer of which etching rate is low is used, whereby a barrier function of the barrier layer 105 can be improved. As the dense layer of which etching rate is low, the nitrogen-containing insulating layer, the silicon oxide layer, the silicon oxynitride layer, the silicon nitride oxide layer, the aluminum nitride layer, or the like can be formed.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride layer or the silicon nitride oxide layer is defined as 100 at. %.

Figure 3A:
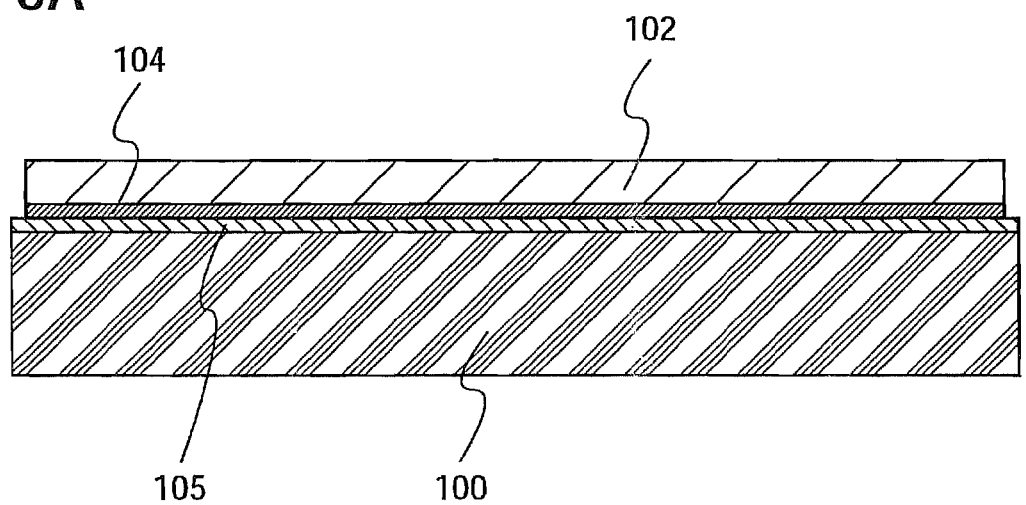
FIGS. 3A and 3B are cross-sectional views each showing a structure of an SOI substrate.

FIG. 3A shows another structure of an SOI substrate according to the present invention. FIG. 3A shows a structure in which the barrier layer 105 is provided between the bonding layer 104 and the base substrate 100. Here, the barrier layer 105 is formed on the base substrate 100, the bonding layer 104 is formed on a surface of the SOI layer 102, and the barrier layer 105 and the bonding layer 104 are bonded to each other. Alternatively, a structure can be employed in which the bonding layer 104 is formed on the base substrate 100, the barrier layer 105 is formed on the surface of the SOI layer 102, and the barrier layer 105 and the bonding layer 104 are bonded to each other. Furthermore, a structure can also be employed in which the barrier layer 105 and the bonding layer 104 are sequentially stacked on one of surfaces of the base substrate 100 or the SOI layer 102 and the bonding layer 104 is bonded to the other of the surfaces of the base substrate 100 and the SOI layer 102.

Figure 3B:
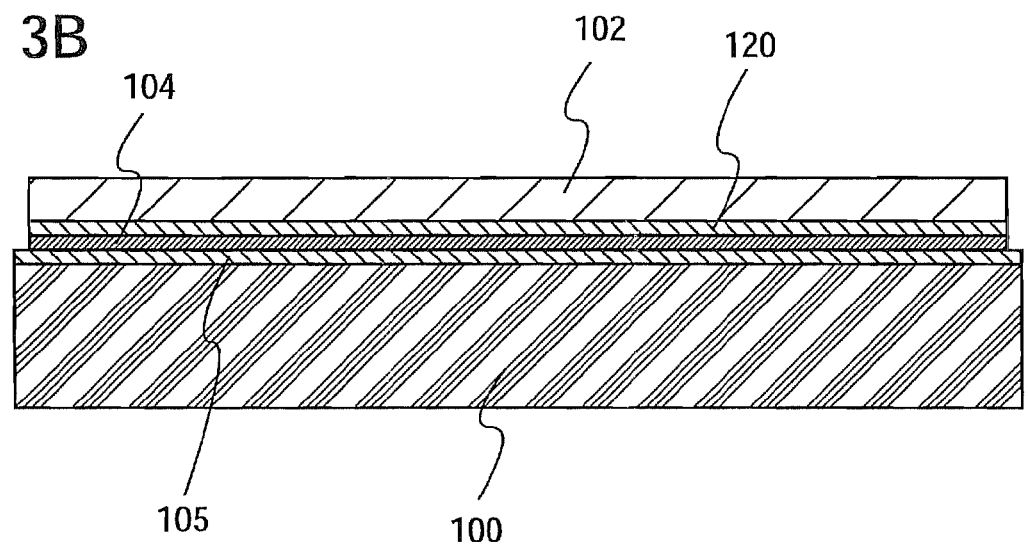

FIG. 3B shows a structure in which the bonding layer 104 and a plurality of barrier layers 105 and 120 are provided between the base substrate 100 and the SOI layer 102. Here, a barrier layer 105 is formed on the base substrate 100, the barrier layer 120 and the bonding layer 104 are sequentially stacked on the surface of the SOI layer 102, and the barrier layer 105 and the bonding layer 104 are bonded to each other. Alternatively, a structure can also be employed in which the barrier layer 105 and the bonding layer 104 are sequentially stacked over the base substrate 100, the barrier layer 120 is provided on the surface of the SOI layer 102, and the barrier layer 120 and the bonding layer 104 are bonded to each other.

Figure 4A:
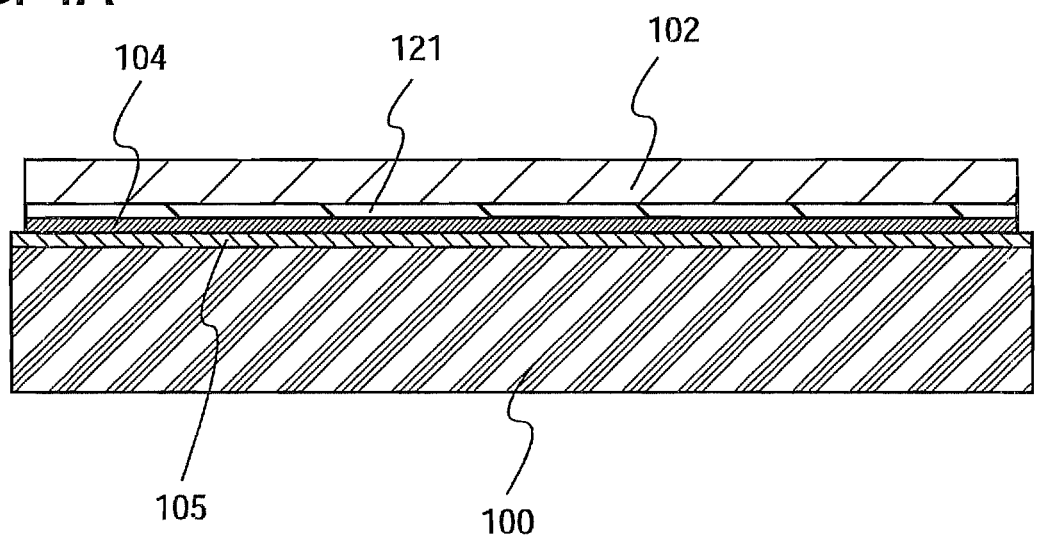
FIGS. 4A and 4B are cross-sectional views each showing a structure of an SOI substrate.
Figure 4B:
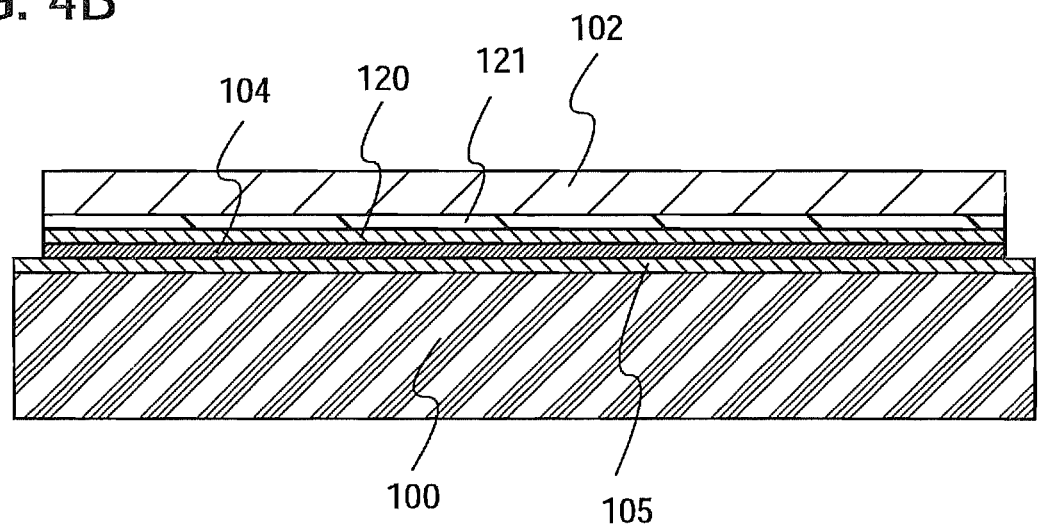

FIGS. 4A and 4B show a structure in which at least an insulating layer 121 is provided between the base substrate 100 and the SOI layer 102 in addition to the barrier layer 105 and the bonding layer 104. The insulating layer 121 can be provided between the SOI layer 102 and the bonding layer 104, between the bonding layer 104 and the barrier layer 105, and between the base substrate 100 and the barrier layer 105.

FIG. 4A shows a structure in which the bonding layer 104, the barrier layer 105 and the insulating layer 121 are provided between the base substrate 100 and the SOI layer 102. Here, the barrier layer 105 is provided on the base substrate 100, the insulating layer 121 and the bonding layer 104 are sequentially stacked over the surface of the SOI layer 102, and the barrier layer 105 and the bonding layer 104 are bonded to each other. Alternatively, a structure can also be employed in which the barrier layer 105 and the bonding layer 104 are sequentially stacked over the base substrate 100, the insulating layer 121 is provided on the surface of the SOI layer 102, and the bonding layer 104 and the insulating layer 121 are bonded to each other.

FIG. 4B shows a structure in which the barrier layer 120 is provided for the SOI layer 102 in addition to the barrier layer 105 over the surface of the base substrate 100. Here, the barrier layer 105 is formed on the base substrate 100, the insulating layer 121, the barrier layer 120, and the bonding layer 104 are sequentially stacked over the surface of the SOI layer 102, and the barrier layer 105 and the bonding layer 104 are bonded to each other. Alternatively, a structure can also be employed in which the barrier layer 105 and the bonding layer 104 are sequentially stacked over the base substrate 100, the insulating layer 121 and the barrier layer 120 are sequentially stacked over the surface of the SOI layer 102, and the bonding layer 104 and the barrier layer 120 are bonded to each other.

The insulating layer 121 is preferably a thermal oxide layer formed by subjecting the single-crystal semiconductor substrate to high-temperature heat treatment. Further, a silicon oxide layer deposited by a chemical vapor deposition method using an organic silane gas similarly to the bonding layer 104 may be used. As the insulating layer 121, chemical oxide can also be used. A chemical oxide can be formed by, for example, treatment of a surface of a single-crystal semiconductor substrate that is to become an SOI layer with ozone-containing water. Because a chemical oxide reflects the shape of the surface of a single-crystal semiconductor substrate, it is preferable that the single-crystal semiconductor substrate be flat so that the chemical oxide also becomes flat.

The SOI substrate described in this embodiment mode is formed by bonding the SOI layer to the flexible substrate; therefore, the SOI substrate described in this embodiment mode is flexible and thin.

(Embodiment Mode 2)

A method for manufacturing the SOI substrate described in Embodiment Mode 1 will be described with reference to FIG. 5A to FIG. 8D.

Figure 5A:
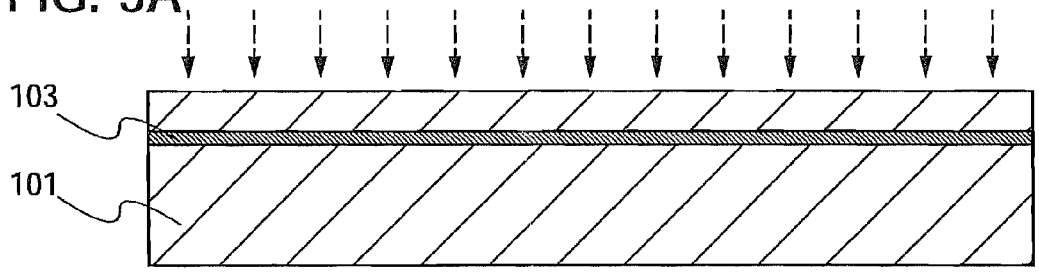
FIGS. 5A to 5D are cross-sectional views explaining a method for manufacturing an SOI substrate.

A single-crystal semiconductor substrate 101 shown in FIG. 5A is cleaned. The single-crystal semiconductor substrate 101 is irradiated with ions accelerated by an electric field from a surface thereof, and elements of the ions are contained at a predetermined depth of the single-crystal semiconductor substrate to form an ion-doped layer. Specifically, the ion-doped layer is a fragile layer containing the elements of the accelerated ions such as a region containing hydrogen, helium or halogen typified by fluorine. Hereinafter, the ion-doped layer is referred to as a fragile region 103. Irradiation with the accelerated ions is performed in consideration of a thickness of an SOI layer which is to be transferred to a base substrate. The thickness of the SOI layer is set to be 5 nm to 500 nm, preferably 10 nm to 200 nm, more preferably 10 nm to 100 nm, and much more preferably, 10 nm to 50 mm. An accelerating voltage when the single-crystal semiconductor substrate 101 is irradiated with the ions is set in consideration of such a thickness. Note that, since a surface of the SOI layer is planarized by polishing or melting after separation, the thickness of the SOI layer right after separation is preferably set to be 50 nm to 500 nm.

The fragile region 103 is formed by irradiating the single-crystal semiconductor substrate with accelerated ions which are generated by plasma excitation using a gas of hydrogen, helium, or a halogen typified by fluorine as a source gas. In this case, it is preferable to perform irradiation with a plurality of ions of a single atom that has different masses or, a plurality of ions of a plurality of atoms that has different masses. As a method of irradiation with such ions, an ion doping method, an ion implantation method, or the like can be given. In the case of irradiating the single-crystal semiconductor substrate with the accelerated hydrogen ions, the hydrogen ions preferably include $H^+$, $H_2^+$, and $H_3^+$ ions with a high proportion of $H_3^+$ ions. With a high proportion of $H_3^+$ ions, the introduction efficiency can be increased and irradiation time can be shortened. By thus performing ion irradiation where the proportion of $H_3^+$ ions is higher than that of $H^+$ ions or $H_2^+$ ions, the single-crystal semiconductor substrate 101 contains a large number of hydrogen ions compared to a case of performing irradiation with the ions where the proportion of $H_3^+$ ions is not high, separation which is to be conducted later at the fragile region 103 can be easily performed by irradiation with a small amount of ions.

When the single-crystal semiconductor substrate 101 is irradiated with the accelerated ions, a surface of the single-crystal semiconductor substrate needs to be irradiated with the ions at high concentration. Therefore, the surface of the single-crystal semiconductor substrate 101 becomes rough in some cases. Therefore, a protective layer for the single-crystal semiconductor substrate 101 using a silicon oxide layer, a silicon nitride layer, a silicon nitride oxide layer, or the like is provided to have a thickness of 50 nm to 200 nm on the surface which is irradiated with the accelerated ions, whereby the surface which is irradiated with the ions can be prevented from being damaged and from losing its flatness, which is preferable.

Note that an ion doping method in this specification refers to a method by which an object is irradiated with an ionized gas that is generated from a source gas and accelerated by an electric field without mass separation and an element of the ionized gas is included in the object. When an ion doping apparatus is used, ion doping can be performed at a high dose with high efficiency even if a large substrate is used.

The accelerating voltage for ion doping may be set to be greater than or equal to 20 kV and less than or equal to 100 kV, preferably, greater than or equal to 20 kV and less than or equal to 70 kV, and the dose may be set to be greater than or equal to $1 \times 10^{16}$ ions/cm$^2$ and less than or equal to $4 \times 10^{16}$ ions/cm$^2$, preferably, greater than or equal to $1 \times 10^{16}$ ions/cm$^2$ and less than or equal to $2.5 \times 10^{16}$ ions/cm$^2$. In this embodiment mode, ion doping is performed with an accelerating voltage of 80 kV and a dose of $2 \times 10^{16}$ ions/cm$^2$.

Figure 5B:
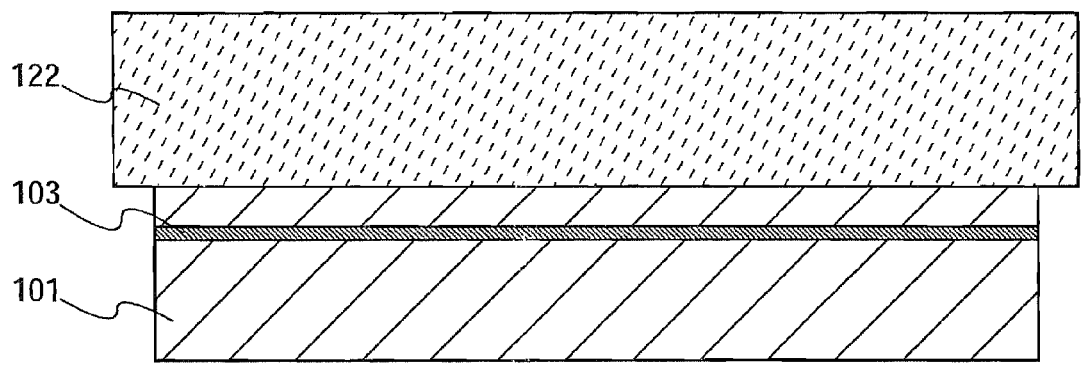

Next, as shown in FIG. 5B, a pressure member 122 is provided on the surface of the single-crystal semiconductor substrate 101, and the single-crystal semiconductor substrate 101 and the pressure member 122 are disposed to contact with each other and heated. That is, heat treatment and pressure treatment are performed, whereby the single-crystal semiconductor substrate 101 can be easily separated from the base substrate 100 using the fragile region 103 as a cleavage plane in a later process. Note that the cleaved surface indicates a region where the single-crystal semiconductor substrate is separated, and hereinafter the cleaved surface is referred to as a separation region. A temperature of heat treatment is less than a temperature at which the fragile region 103 is separated and is preferably a temperature at which the fragile region 103 is fragile. For example, heat treatment is performed at temperatures of greater than or equal to 250° C., preferably greater than or equal to 300° C. and less than 400° C., more preferably less than 350° C., whereby a change in the volume of fine voids formed in the fragile region 103 occurs. However, since the pressure member 122 is provided on the surface of the single-crystal semiconductor substrate, flatness of the surface of the single-crystal semiconductor substrate can be kept. As a result, distortion occurs in the fragile region 103 due to a change in the volume of the fine voids formed in the fragile region 103, so that the fragile region 103 can be made to be more fragile along the fragile region. The pressure treatment is performed so that a pressure is applied perpendicular to a bonding surface in consideration of the pressure resistance of the base substrate 100 and the single-crystal semiconductor substrate 101.

Figure 5C:
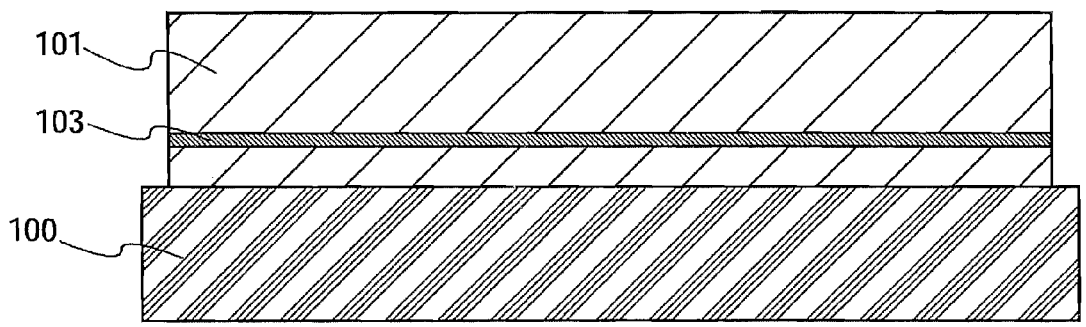

FIG. 5C shows a mode where the base substrate 100 is disposed in contact with the single-crystal semiconductor substrate 101 and the both substrates are bonded to each other. A surface that is to form bond is cleaned sufficiently. Then, the base substrate 100 and the single-crystal semiconductor substrate 101 are disposed in contact with each other with a pressure applied, so that the base substrate 100 and the single-crystal semiconductor substrate 101 are bonded to each other. The bond is formed by Van der Waals forces. The base substrate 100 and the single-crystal semiconductor substrate 101 are disposed in contact with each other with a pressure applied, whereby a stronger bond than the bond by Van der Waals forces can be formed by hydrogen bonding.

In order to form a favorable bond, the surface that is to form a bond is preferably activated. For example, the surface that is to form a bond is irradiated with an atomic beam or an ion beam. When an atomic beam or an ion beam is used, an inert gas neutral atomic beam or inert gas ion beam of argon or the like can be used. Alternatively, plasma irradiation or radical treatment is performed. Further, at least one of bonding surfaces of a flexible substrate having an insulating surface and a single-crystal semiconductor layer may be subjected to treatment by oxygen plasma or washing with ozone water to be hydrophilic. Such surface treatment makes it possible to easily increase bonding strength between different kinds of materials even if a later heat treatment is performed at temperatures of greater than or equal to 250° C. and less than 400° C.

Note that, instead of heat treatment which is performed before bonding the single-crystal semiconductor substrate 101 to the base substrate 100, the single-crystal semiconductor substrate 101 may be irradiated with a laser beam from the side of the base substrate 100 or the single-crystal semiconductor substrate 101 after bonding the single-crystal semiconductor substrate 101 to the base substrate 100, so that the fragile region 103 may be heated. Note that when irradiation with a laser beam is performed from the single-crystal semiconductor substrate 101 side, a laser beam of infrared light is used. As a result, the fragile region is formed and the single-crystal semiconductor substrate 101 can be separated from the base substrate 100 using the fragile region as a separation region.

Figure 5D:
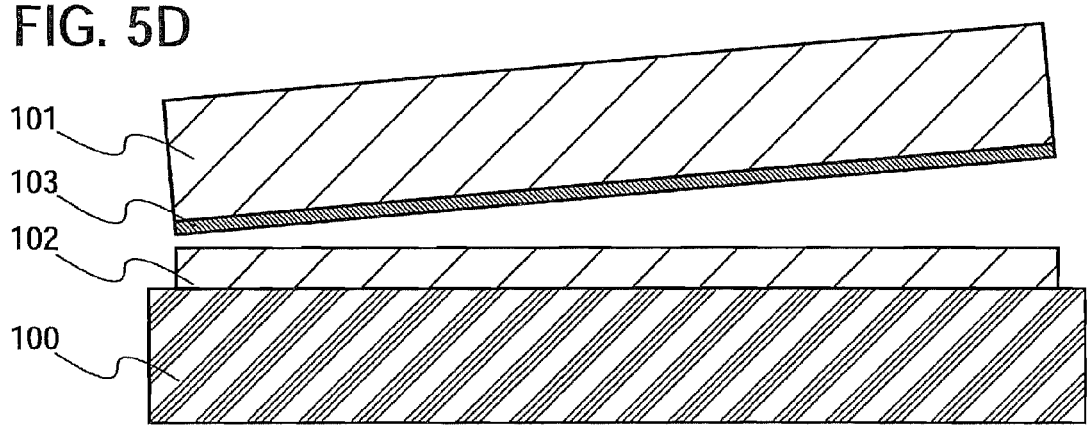

As shown in FIG. 5D, after bonding the single-crystal semiconductor substrate 101 to the base substrate 100, the single-crystal semiconductor substrate 101 is separated from the base substrate 100 using the fragile region 103 as a separation region, thereby obtaining an SOI substrate. Since the surface of the single-crystal semiconductor substrate 101 is bonded to the base substrate 100, an SOI layer 102 having the same crystallinity as the single-crystal semiconductor substrate 101 is left remaining on the base substrate 100.

Before the single-crystal semiconductor substrate 101 is separated from the base substrate 100 using the fragile region 103 as a separation region, a trigger is preferably made so that separation can be conducted easily. Specifically, pretreatment is performed by which adhesion between the fragile region 103 and the SOI layer 102 is as selected (partially) lowered, whereby separation defects are reduced and a yield is improved. Typically, an example can be given in which a groove is formed in the fragile region 103 by a laser beam or a dicer from the side of the base substrate 100 or the single-crystal semiconductor substrate 101.

When the single-crystal semiconductor substrate 101 is separated from the base substrate 100, an adhesive sheet which can be separated by light or heat is provided on at least one of the surfaces of the base substrate 100 and the single-crystal semiconductor substrate 101, one of the base substrate 100 and the single-crystal semiconductor substrate 101 is fixed, and the other is separated, so that separation can be conducted easily. At this time, by provision of a supporting member for the other of the base substrate 100 and the single-crystal semiconductor substrate 101 which is not fixed, a separation process can be conducted easily.

Note that the SOI layer obtained by separation is preferably subjected to CMP (chemical mechanical polishing) so that a surface of the SOI layer is planarized. Further, the surface of the SOI layer may be planarized by irradiating the surface with a laser beam without using a physical polishing method such as CMP. Note that laser beam irradiation is preferably performed in a nitrogen atmosphere at an oxygen concentration of less than or equal to 10 ppm. This is because there is a possibility that the surface of the SOI layer becomes rough when irradiation with a laser beam is performed in an oxygen atmosphere. CMP or the like may be performed in order that the SOI layer obtained is thinned.

Further, before provision of the pressure member 122 on the surface of the single-crystal semiconductor substrate 101 shown in FIG. 5B, a bonding layer 104 may be formed on the surface of the single-crystal semiconductor substrate 101. Alternatively, the pressure member 122 is provided on the surface of the single-crystal semiconductor substrate 101 shown in FIG. 5B, the single-crystal semiconductor substrate 101 and the pressure member 122 are disposed in contact with each other and heated, and then the bonding layer 104 may be formed on the surface of the single-crystal semiconductor substrate 101. After that, as illustrated in FIG. 5C, the bonding layer 104 and the base substrate 100 are disposed in contact with each other, whereby the both can be easily bonded to each other.

According to this embodiment mode, a flexible substrate with low heat resistance and the single-crystal semiconductor substrate can be bonded to each other, thereby manufacturing the SOI substrate. With this structure, even if a substrate of which heatresistant temperature is low such as a plastic substrate is used, the SOI substrate having the SOI layer which is bonded to the substrate by the bonding portions with high bonding strength can be obtained with high yield. Further, the SOI substrate which is flexible and thin can be manufactured.

(Embodiment Mode 3)

Next, a method for manufacturing a SOI substrate which is different from that described in the above embodiment mode will be described with reference to FIGS. 6A to 6D. In FIGS. 6A to 6D, a mode is described in which a base substrate 100 and a single-crystal semiconductor substrate 101 are bonded to each other using a bonding layer. In addition, a mode is described in which the base substrate 100 and the single-crystal semiconductor substrate 101 are bonded to each other without using a pressure member.

Figure 6A:
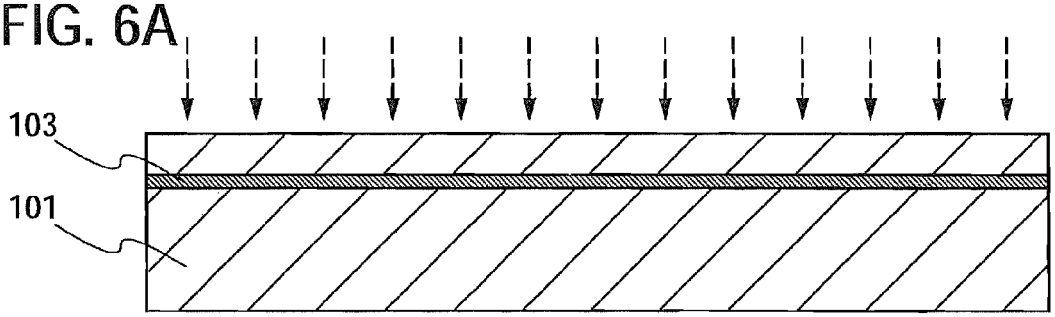
FIGS. 6A to 6D are cross-sectional views explaining a method for manufacturing an SOI substrate.

Similarly to FIG. 5A, as shown in FIG. 6A, the single-crystal semiconductor substrate 101 which is cleaned is irradiated with ions accelerated by an electric field from a surface thereof, and elements of the ions are contained at a predetermined depth of the single-crystal semiconductor substrate to form a fragile region 103.

Figure 6B:
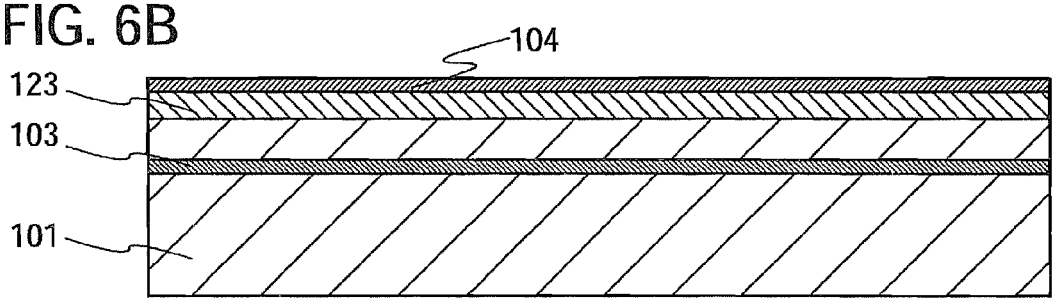

Next, as shown in FIG. 6B, at least a cap layer 123 and a bonding layer 104 are formed over the single-crystal semiconductor substrate 101. Here, the cap layer 123 is formed on the surface of the single-crystal semiconductor substrate 101 and the bonding layer 104 is formed on the cap layer 123.

Here, the thickness of at least one of the bonding layer 104 and the cap layer 123 is preferably thick. Although a change in the volume of the fine voids formed in the fragile region 103 occurs by heat treatment in a later process, the cap layer 123 is provided on the surface of the single-crystal semiconductor substrate, so that flatness of the surface of the single-crystal semiconductor substrate can be kept. Accordingly, flatness of the bonding layer 104 provided on the cap layer 123 can also be kept. As a result, distortion occurs in the fragile region 103 due to the change in the volume of fine voids formed in the fragile region 103, so that the fragile region 103 can be made to be more fragile along the fragile region. In particular, when the thickness of the cap layer 123 is made to be large, a pressure is applied perpendicular to the surface of the single-crystal semiconductor substrate 101 in heat treatment, so that flatness of the surface of the single-crystal semiconductor substrate to which ions are irradiated can be kept and the fragile region can be formed.

The cap layer 123 can be formed using a single layer or a stacked layer of a nitrogen-containing insulating layer and/or a silicon oxide layer. Note that, when a part or a whole of the cap layer 123 is formed using the nitrogen-containing insulating layer, the cap layer 123 also functions as a barrier layer, which is preferable.

Next, heating is performed and a change in the volume of the fine voids formed in the fragile region 103 occurs. As a result, the single-crystal semiconductor substrate 101 can be easily separated from the base substrate 100 using the fragile region as a separation region in a later process. The temperature of heat treatment is preferably less than a temperature at which separation occurs at the fragile region 103 and greater than or equal to a temperature at which the fragile region 103 is formed. For example, heat treatment is performed at temperatures of greater than or equal to 250° C., preferably greater than or equal to 300° C. and less than 400° C., more preferably less than 350° C.

Figure 6C:
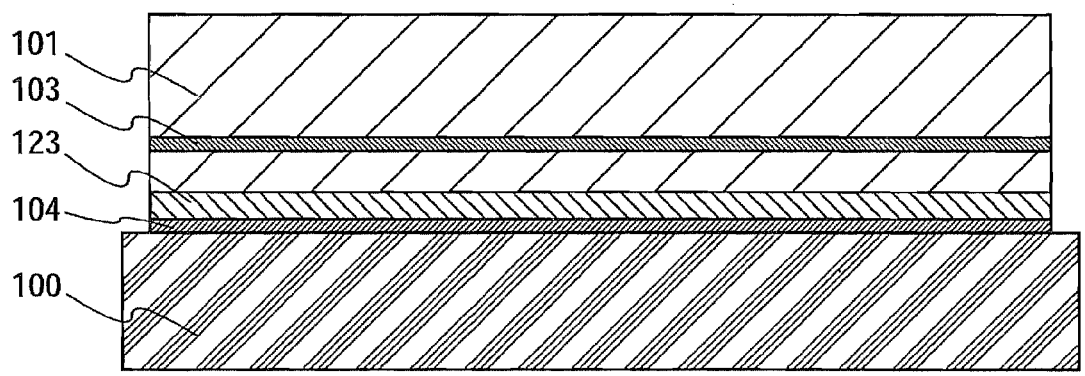

In FIG. 6C, the single-crystal semiconductor substrate 101 is provided with the cap layer 123 and the bonding layer 104. FIG. 6C shows a process in which the bonding layer 104 and the base substrate 100 are disposed in contact with each other and bonded to each other. The bonding layer 104 provided for the single-crystal semiconductor substrate 101 and the base substrate 100 are bonded to each other by being disposed in contact with each other.

In order to form a favorable bond, at least one of the surfaces of the bonding layer 104 and the base substrate 100 may be activated. For example, the surface that is to form a bond is irradiated with an atomic beam or an ion beam. When an atomic beam or an ion beam is used, an inert gas neutral atomic beam or inert gas ion beam of argon or the like can be used. Alternatively, plasma irradiation or radical treatment is performed. Further, at least one of the bonding surfaces of the base substrate 100 and the bonding layer 104 may be subjected to treatment by oxygen plasma or washing with ozone water to be hydrophilic. Such a surface treatment makes it possible to easily perform bonding between different kinds of materials even if heat treatment is performed at temperature of less than 400° C.

Figure 6D:
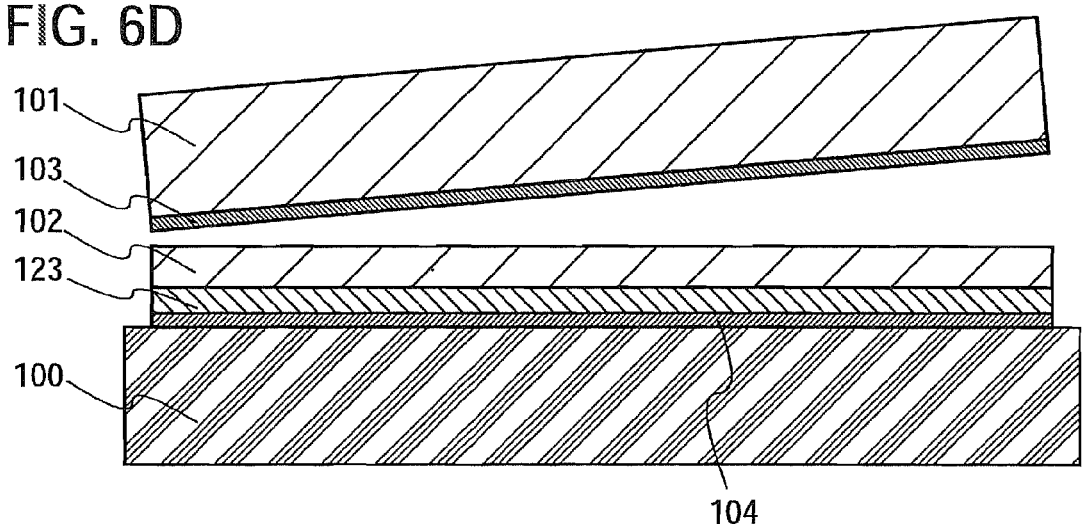

After that, the SOI substrate can be obtained by separation of the single-crystal semiconductor substrate 101 as shown in FIG. 6D. Note that the surface of the SOI layer obtained by separation is preferably planarized. Further, CMP or the like may be performed in order that the SOI layer obtained is thinned. Before the single-crystal semiconductor substrate 101 is separated from the base substrate 100 using the fragile region 103 as a separation region, a trigger may be made so that separation can be conducted easily. When the single-crystal semiconductor substrate 101 is separated from the base substrate 100, an adhesive sheet which can be separated by light or heat is provided on at least one of the surfaces of the base substrate 100 and the single-crystal semiconductor substrate 101, one of the base substrate 100 and the single-crystal semiconductor substrate 101 is fixed, and the other is separated, so that separation can be conducted more easily. At this time, by provision of a supporting member for the other of the base substrate 100 and the single-crystal semiconductor substrate 101 which is not fixed, a separation process can be conducted easily.

Note that, instead of heat treatment which is performed before bonding the single-crystal semiconductor substrate 101 to the base substrate 100, the single-crystal semiconductor substrate may be irradiated with a laser beam from the base substrate 100 side or the single-crystal semiconductor substrate 101 side after bonding the single-crystal semiconductor substrate 101 to the base substrate 100, and the fragile region 103 may be heated. Note that when irradiation with a laser beam is performed from the single-crystal semiconductor substrate 101 side, a laser beam with a wavelength which the single-crystal semiconductor substrate absorbs, typically, infrared light is used. As a result, the single-crystal semiconductor substrate 101 can be separated from the base substrate 100 using the fragile region as a separation region.

According to this embodiment mode, a flexible substrate with low heat resistance and the single-crystal semiconductor substrate can be bonded to each other, thereby manufacturing the SOI substrate. With this structure, even if a substrate of which heatresistant temperature is low such as a plastic substrate is used, the SOI substrate having the SOI layer which is bonded to the substrate by the bonding portions with high bonding strength can be obtained with high yield. Further, the SOI substrate which is flexible and thin can be manufactured.
(Embodiment Mode 4)

Next, a method for manufacturing an SOI substrate which is different from that described in the above embodiment modes will be described with reference to FIGS. 7A to 7D. Here, a separation layer is formed on a supporting substrate, and an SOI layer is formed on the separation layer. After a base substrate is bonded to the SOI layer, the base substrate is separated from the supporting substrate. Thus, the SOI substrate is manufactured.

As shown in FIG. 7A, a separation layer 131 is formed on a supporting substrate 130, and an insulating layer 132 is formed on the separation layer 131. Here, the supporting substrate 130 is a substrate for forming the separation layer. As the supporting substrate 130, a substrate having heat resistance which can withstand a heat treatment temperature at which a crack is generated in a fragile region (typically, 400° C. to 600° C.) is preferably used. Typically, a glass substrate, a quartz substrate, a ceramic substrate, a metal substrate, a silicon wafer, or the like can be used.

The separation layer 131 is formed using a single layer or a stacked layer formed of an element selected from tungsten, molybdenum, titanium, tantalum, niobium, nickel, cobalt, zirconium, zinc, ruthenium, rhodium, palladium, osmium, iridium, or silicon, or an alloy material or a compound material containing the above-described element as its main component by a sputtering method, a plasma CVD method, a coating method, a printing method, or the like. When a layer containing silicon is formed as the separation layer 131, a crystal structure of the layer containing silicon may be any of an amorphous structure, a microcrystalline structure, and a polycrystalline structure. Here, a coating method is a method in which a solution is discharged over an object to be processed to form the separation layer such as a spin coating method or a droplet discharging method. A droplet discharging method is a method in which droplets of a composition that contains fine particles are discharged through a minute hole and formed into a pattern with a predetermined shape.

When the separation layer 131 has a single layer structure, a layer containing tungsten, molybdenum, or a mixture of tungsten and molybdenum is preferably formed. Alternatively, a layer containing any one of following is formed: tungsten oxide, tungsten oxynitride, molybdenum oxide, molybdenum oxynitride, an oxide of a mixture of tungsten and molybdenum or an oxynitride of a mixture of tungsten and molybdenum is formed. Note that the mixture of tungsten and molybdenum corresponds to, for example, an alloy of tungsten and molybdenum.

When the separation layer 131 has a stacked layer structure, a metal layer is preferably formed as a first layer and a metal oxide layer is preferably formed as a second layer. Typically, a layer containing tungsten, molybdenum or a mixture of tungsten and molybdenum is formed as a first layer, and a layer containing any of the following is formed as a second layer: an oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; and a nitride oxide of tungsten, molybdenum, or a mixture of tungsten and molybdenum.

When the separation layer 131 has a stacked layer structure in which a metal layer is formed as the first layer and a metal oxide layer is formed as the second layer, the stacked layer structure may be formed by utilizing the following: for example, a layer containing tungsten is formed as the metal layer, and for example, a silicon oxide layer is formed thereover as the insulating layer 132 formed of an oxide, whereby a layer containing an oxide of tungsten is formed as the metal oxide layer in an interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizability such as ozone water, or the like.

Further, as the separation layer 131, a metal layer may be formed as the first layer, and a metal nitride layer or a metal oxynitride layer may be formed as the second layer. Typically, after formation of a layer containing tungsten as the first layer, a tungsten nitride layer or a tungsten oxynitride layer may be formed as the second layer.

The insulating layer 132 is formed using a single layer or multilayer structure with the use of an inorganic compound by a sputtering method, a plasma CVD method, a coating method, a printing method, or the like. As a typical example of the inorganic compound, silicon oxide, silicon nitride, silicon oxynitride, silicon nitride oxide, or the like can be given. Note that silicon nitride, silicon nitride oxide, silicon oxynitride, or the like is used for the insulating layer 132 which functions as a base layer, whereby entry of moisture or a gas such as oxygen or the like from outside to an element layer which is to be formed later can be prevented.

Further, the insulating layer 132 may have a stacked layer structure. For example, the insulating layer 132 may be formed by stacking layers of an inorganic compound. Typically, the insulating layer 132 may be formed by stacking two or more layers of silicon oxide, silicon nitride oxide, silicon nitride, and silicon oxynitride.

Next, the single-crystal semiconductor substrate 101 having the fragile region 103 which is made to be fragile by a process described in Embodiment Mode 2 or 3 and the insulating layer 132 are bonded to each other by being disposed in contact with each other.

In order to form a favorable bond, at least one of the surfaces of the insulating layer 132 and the single-crystal semiconductor substrate 101 may be activated. For example, the surface that is to form a bond is irradiated with an atomic beam or an ion beam. When an atomic beam or an ion beam is used, an inert gas neutral atomic beam or inert gas ion beam of argon or the like can be used. Alternatively, plasma irradiation or radical treatment is performed. Further, at least one of the bonding surfaces of the insulating layer 132 and the single-crystal semiconductor substrate 101 may be subjected to treatment by oxygen plasma or washing with ozone water to be hydrophilic. Such a surface treatment makes it possible to easily perform bonding between different kinds of materials even if temperatures of a heat treatment step is greater than or equal to 250° C. and less than 400° C.

As shown in FIG. 7B, the single-crystal semiconductor substrate 101 is separated from the supporting substrate 130 using the fragile region 103 as a separation region by heat treatment and pressure treatment. The heat treatment is preferably performed at a temperature equal to or lower than the heat resistant temperature of the supporting substrate 130. For example, heat treatment is performed at 400° C. to 600° C., whereby a change in the volume of the fine voids formed in the fragile region 103 occurs, the single-crystal semiconductor substrate 101 can be separated from the supporting substrate 130 along the fragile region 103.

At this time, instead of heat treatment, the single-crystal semiconductor substrate 101 is irradiated with a laser beam so that a change in the volume of the fine voids formed in the fragile region 103 may occur. A laser beam which is transmitted through the single-crystal semiconductor substrate and has a wavelength absorbed by the element contained in the fragile region 103 is preferably used. Typically, infrared light can be used.

After separation of the single-crystal semiconductor substrate, a surface of the SOI layer is preferably planarized. Further, CMP or the like may be performed in order that the SOI layer obtained is thinned. Before the single-crystal semiconductor substrate 101 is separated from the supporting substrate 130 using the fragile region 103 as a separation region, a trigger may be made so that separation can be conducted easily. When the single-crystal semiconductor substrate 101 is separated from the supporting substrate 130, an adhesive sheet which can be separated by light or heat is provided on at least one of the surfaces of the supporting substrate 130 and the single-crystal semiconductor substrate 101, one of the supporting substrate 130 and the single-crystal semiconductor substrate 101 is fixed, and the other is separated, so that separation can be conducted more easily. At this time, by provision of a supporting member for the other of the supporting substrate 130 and the single-crystal semiconductor substrate 101 which is not fixed, a separation process can be conducted easily.

Next, as shown in FIG. 7C, by thermal pressure bonding of the base substrate 100 and the SOI layer 102, bonding, the base substrate 100 can be attached firmly to the SOI layer 102. Alternatively, the base substrate 100 can be attached firmly to the SOI layer 102 using an adhesive (not shown). As described in Embodiment Mode 2, the SOI layer 102 and the base substrate 100 may be bonded to each other by being disposed in contact with each other.

Next, as shown in FIG. 7D, the base substrate 100 to which the SOI layer is attached firmly is separated from the supporting substrate 130 by a physical method. A physical method refers to a dynamic method or a mechanical method which changes some kind of dynamic energy or mechanical energy. A typical physical method refers to the application of mechanical power, for example, pulling by a human hand or a gripping tool, or separating while rolling a roller. At this time, if an adhesive sheet which can be separated by light or heat is provided on at least one of the surfaces of the base substrate 100 and the supporting substrate 130, separation can be conducted more easily.

A liquid penetrates into an interface of the separation layer 131 and the insulating layer 132, and then the base substrate 100 may be separated from the supporting substrate 130.

Here, separation is caused at any of the interface of the separation layer 131 and the insulating layer 132, the separation layer 131 and an interface of the supporting substrate 130 and the separation layer 131, so that an element layer can be separated from the supporting substrate 130.

Note that, before the separation process, a trigger may be made for the separation layer 131 so that separation can be conducted easily. When the single-crystal semiconductor substrate 101 is separated from the supporting substrate 130, an adhesive sheet which can be separated by light or heat is provided on at least one of the surfaces of the supporting substrate 130 and the single-crystal semiconductor substrate 101, one of the base substrate 100 and the supporting substrate 130 is fixed, and the other is separated, so that separation can be conducted more easily. At this time, by provision of a supporting member for the other of the supporting substrate 130 and the single-crystal semiconductor substrate 101 which is not fixed, a separation process can be conducted easily.

After that, the insulating layer 132 which is bonded to the surface of the SOI layer 102 may be removed. Through the above process, the SOI substrate can be manufactured. According to this embodiment mode, the single-crystal semiconductor substrate in which the fragile region is formed is heated, the SOI layer is separated, and then the base substrate is attached firmly to the SOI layer. After the SOI layer is once held over the supporting substrate which can be handled easily, the base substrate is attached firmly to the SOI layer and the SOI layer is separated from the supporting substrate. Accordingly, the SOI substrate in which the SOI layer is provided on the base substrate with low heat resistance can be manufactured with high yield.

According to this embodiment mode, the flexible substrate with low heat resistance and the single-crystal semiconductor substrate are bonded to each other, so that the SOI substrate can be manufactured. With this structure, even if a substrate of which heat resistant temperature is low such as a plastic substrate is used, the SOI substrate having the SOI layer which is bonded to the substrate by the bonding portions with high bonding strength can be obtained with high yield. Since the supporting substrate is handled more easily than the flexible substrate, the supporting substrate is handled easily in the manufacturing process, so that a yield can be improved. Further, the SOI substrate which is flexible and thin can be manufactured.

(Embodiment Mode 5)

Next, a method for manufacturing an SOI substrate which is different from those described in the above embodiment modes will be described with reference to FIGS. 8A to 8D. Here, the SOI substrate is manufactured using a base substrate 100 of which heat resistant temperature is less than or equal to 700° C.

Figure 8A:
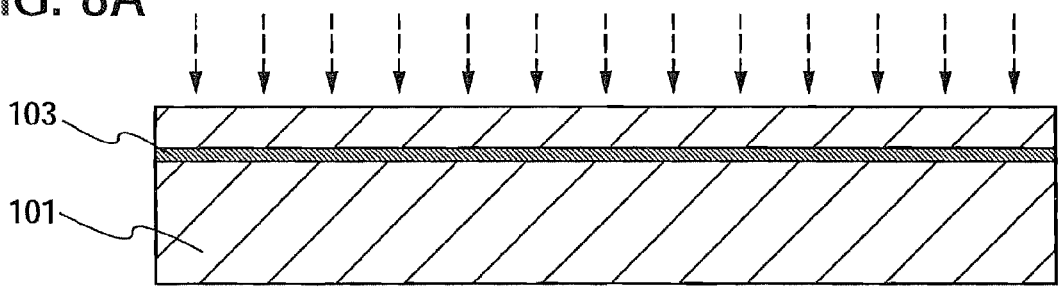
FIGS. 8A to 8D are cross-sectional views explaining a method for manufacturing an SOI substrate.

Similarly to FIG. 5A, as shown in FIG. 8A, a single-crystal semiconductor substrate 101 which is cleaned is irradiated with ions accelerated by an electric filed, the ions are contained at a predetermined depth of the single-crystal semiconductor substrate to form a fragile region 103.

Figure 8B:
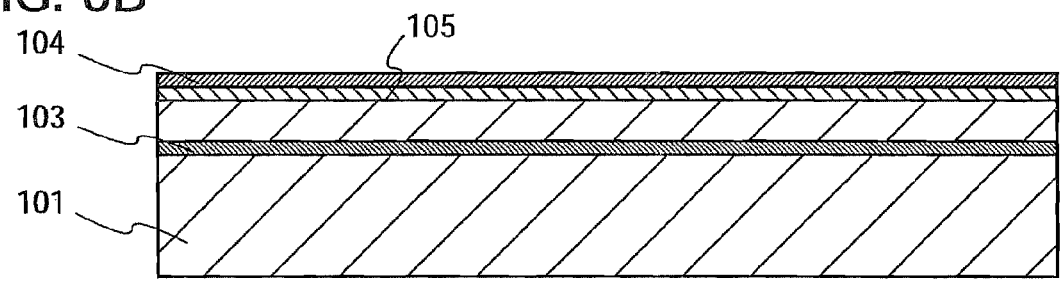

Next, as shown in FIG. 8B, at least a bonding layer 104 is formed over the single-crystal semiconductor substrate 101. Here, a barrier layer 105 is formed on a surface of the single-crystal semiconductor substrate 101 and the bonding layer 104 is formed on the barrier layer 105.

The barrier layer 105 preferably includes at least a nitrogen-containing insulating layer. The nitrogen-containing insulating layer is formed by stacking a single layer or a plurality of layers selected from, typically, a silicon nitride layer, a silicon nitride oxide layer, a silicon oxynitride layer, an aluminum nitride layer, an aluminum nitride oxide layer, or an aluminum oxynitride layer. The barrier layer 105 can be formed, for example, by stacking a silicon oxynitride layer and a silicon nitride oxide layer from the single-crystal semiconductor substrate 101 side. The barrier layer 105 can be formed by a plasma CVD method, a sputtering method, or the like.

Figure 8C:
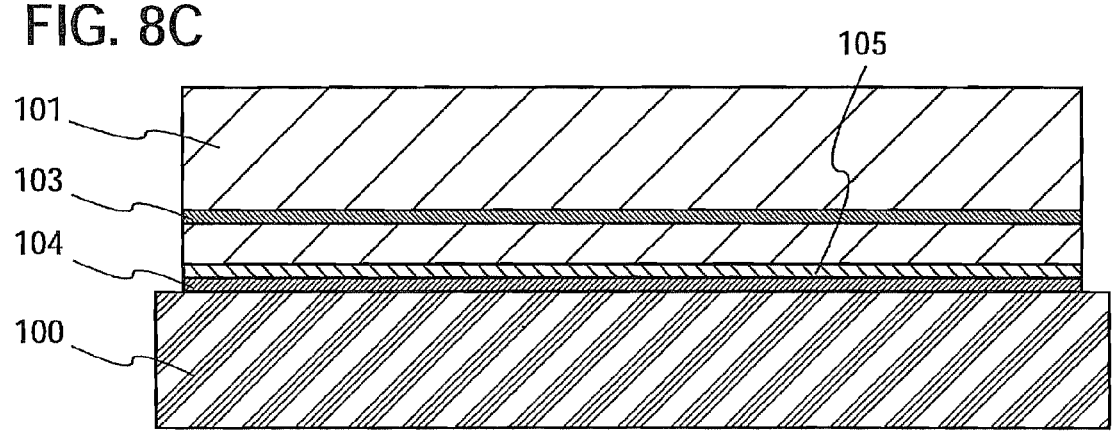

FIG. 8C shows a process in which the bonding layer 104 formed over the single-crystal semiconductor substrate 101 and the base substrate 100 are bonded to each other by being disposed in contact with each other. The bonding layer 104 provided for the single-crystal semiconductor substrate 101 and the base substrate 100 are bonded to each other by being disposed in contact with each other. Here, the heat resistant temperature of the base substrate 100 is preferably less than or equal to 700° C. Typically, a flexible glass substrate, a flexible metal film which has an insulating layer or the like can be used. When the base substrate 100 has such heat resistance, heat treatment by which separation can be conducted along the fragile region 103 can be performed.

In order to form a favorable bond, at least one of the surfaces of the base substrate 100 and the bonding layer 104 may be activated. For example, the surface that is to form a bond is irradiated with an atomic beam or an ion beam. When an atomic beam or an ion beam is used, an inert gas neutral atomic beam or inert gas ion beam of argon or the like can be used. Alternatively, plasma irradiation or radical treatment is performed. Further, at least one of the bonding surfaces of the flexible substrate having an insulating surface and the single-crystal semiconductor substrate may be subjected to a treatment by oxygen plasma or washing with ozone water to be hydrophilic. Such a surface treatment makes it possible to easily perform bonding between different kinds of materials even if temperatures of a heat treatment step is greater than or equal to 250° C. and less than 400° C.

Figure 8D:
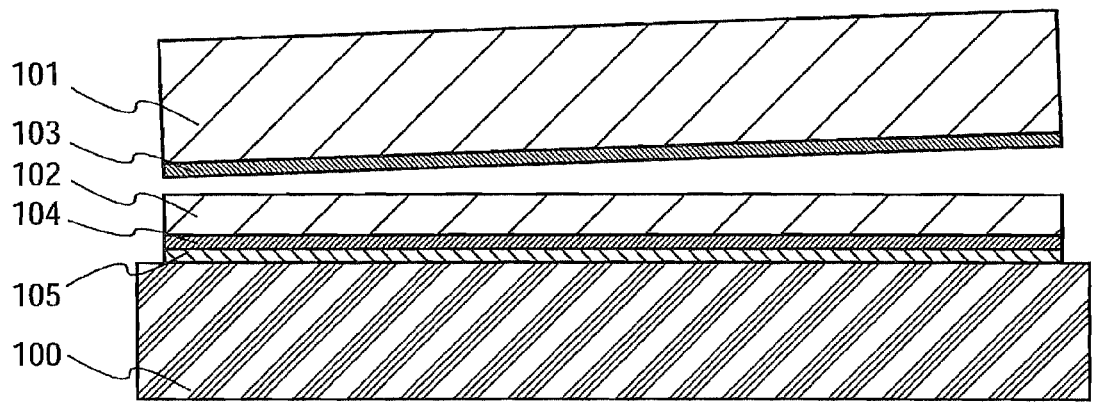

After that, heat treatment and a pressure treatment are performed, so that the single-crystal semiconductor substrate 101 can be separated from the base substrate 100 using the fragile region 103 as a separation region as shown in FIG. 8D. The heat treatment is preferably performed at a temperature equal to or lower than the heat resistant temperature of the base substrate 100. For example, heat treatment is performed at 400° C. to 600° C., whereby a change in the volume of the fine voids formed in the fragile region 103 occurs, and the single-crystal semiconductor substrate 101 can be separated from the base substrate 100 along the fragile region 103. The pressure treatment is performed so that a pressure is applied perpendicular to a bonding surface in consideration of pressure resistance of the base substrate 100 and the single-crystal semiconductor substrate 101.

At this time, instead of heat treatment, the single-crystal semiconductor substrate 101 is irradiated with a laser beam and a change in the volume of the fine voids formed in the fragile region 103 may occur. A laser beam which is transmitted through the single-crystal semiconductor substrate and has a wavelength absorbed by the element contained in the fragile region 103 is preferably used. Typically, infrared light can be used.

Instead of heat treatment, the single-crystal semiconductor substrate may be irradiated with a laser beam from the base substrate 100 side after bonding the single-crystal semiconductor substrate 101 to the base substrate 100, and the fragile region 103 may be heated. As a result, the single-crystal semiconductor substrate 101 can be separated from the base substrate 100 using the fragile region as a separation region.

Note that the surface of the SOI layer obtained by separation is preferably planarized. Further, CMP or the like may be performed in order that the SOI layer obtained is thinned. Before the single-crystal semiconductor substrate 101 is separated from the base substrate 100 using the fragile region 103 as a separation region, a trigger may be made so that separation can be conducted easily. When the single-crystal semiconductor substrate 101 is separated from the base substrate 100, an adhesive sheet which can be separated by light or heat is provided on at least one of the surfaces of the base substrate 100 and the single-crystal semiconductor substrate 101, one of the base substrate 100 and the single-crystal semiconductor substrate 101 is fixed, and the other is separated, so that separation can be conducted more easily. At this time, by provision of a supporting member for the other of the base substrate 100 and the single-crystal semiconductor substrate 101 which is not fixed, a separation process can be conducted easily.

In this manner, according to this embodiment mode, even if the base substrate 100 such as a glass substrate of which heat resistant temperature is less than or equal to 700° C. is used, the SOI layer 102 with high bonding strength with the bonding portion of the base substrate can be obtained. As the base substrate 100, any of a variety of glass substrates that are used in the electronics industry and that are referred to as non-alkali glass substrates, such as aluminosilicate glass substrates, aluminoborosilicate glass substrates, and barium borosilicate glass substrates, can be used. In other words, a single-crystal semiconductor layer can be formed over a substrate that is longer than one meter on each side. With the use of such a large-area substrate, not only a display device such as a liquid crystal display but also a semiconductor integrated circuit can be manufactured.

In this embodiment mode, an integrated circuit is formed using the single-crystal semiconductor layer which is bonded to the flexible supporting substrate having an insulating surface, whereby a semiconductor device with increased processing speed and with low power consumption can be manufactured. Further, a semiconductor device which is flexible and thin can be manufactured.

(Embodiment Mode 6)

Next, a semiconductor device using the SOI substrate described in Embodiment Modes 1 to 5 will be described with reference to FIGS. 9A to 9E and FIGS. 10A and 10B. Here, a mode in which a semiconductor device is manufactured using the SOI substrate where the single-crystal semiconductor substrate and the base substrate are bonded to each other using a bonding layer 104 as shown in FIGS. 6A to 6D and 8A to 8D will be described. The SOI substrate where the single-crystal semiconductor substrate and the base substrate are bonded to each other without using the bonding layer as shown in FIGS. 5A to 5D and 7A to 7D can also be used. A supporting substrate may be bonded to the base substrate of the SOI substrate. The SOI substrate is held by a holding member which holds the SOI substrate, whereby a semiconductor device can be manufactured with high yield even if a flexible substrate that is easily bent is used. As an example of the holding member, a roller, a gripper, or the like can be given.

Figure 9A:
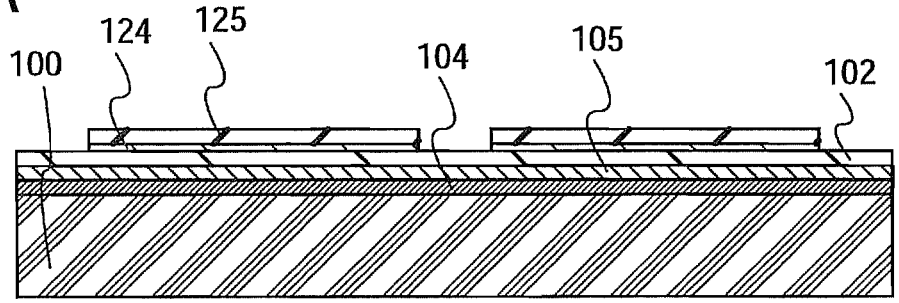
FIGS. 9A to 9E are cross-sectional views explaining a method for manufacturing a semiconductor device using an SOI substrate.

In FIG. 9A, an SOI layer 102 is provided over a base substrate 100 with a bonding layer 104 and a barrier layer 105 interposed therebetween. Over the SOI layer 102, a silicon nitride layer 124 and a silicon oxide layer 125 are formed in a region corresponding to an element formation region. The silicon oxide layer 125 is used as a hard mask when the SOI layer 102 is etched for element isolation. The silicon nitride layer 124 is used as an etching stopper.

The thickness of the SOI layer 102 ranges from 5 nm to 500 nm, preferably, 10 nm to 200 nm. The thickness of the SOI layer 102 can be set as appropriate by control of the depth of the fragile region 103 that is shown in FIGS. 5A to 5D. To the SOI layer 102, a p-type impurity such as boron, aluminum or gallium is added in order to control threshold voltage. For example, boron may be added as a p-type impurity at a concentration of greater than or equal to $5\times10^{16}$ cm$^{-3}$ and less than or equal to $1\times10^{18}$ cm$^{-3}$.

Figure 9B:
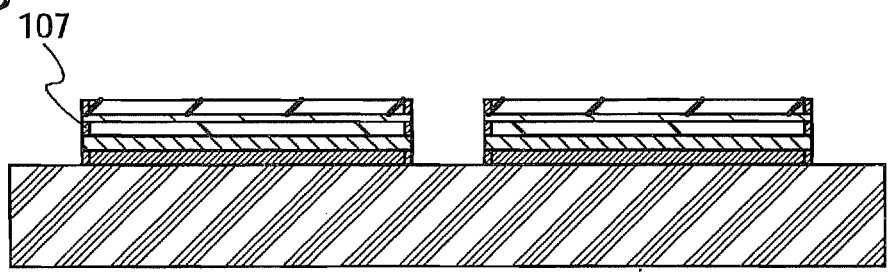

FIG. 9B shows a step of etching the SOI layer 102 and the bonding layer 104 with the silicon oxide layer 125 used as a mask. Next, exposed end surfaces of the SOI layer 102 and the bonding layer 104 are nitrided by plasma treatment. By this nitridation treatment, a silicon nitride layer 107 is formed in at least a peripheral end portion of the SOI layer 102. The silicon nitride layer 107 has an insulating property and has the effect of preventing leak current from flowing along the end surface of the SOI layer 102. In addition, because of its resistance to oxidation, the silicon nitride layer 107 can prevent an oxide layer from growing from the end surface into a "bird's beak" between the SOI layer 102 and the barrier layer 105.

Figure 9C:
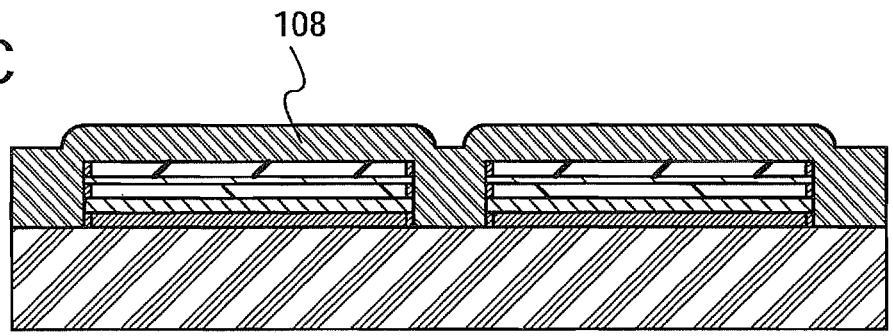

FIG. 9C shows a step of deposition of an element isolation insulating layer 108. As the element isolation insulating layer 108, a silicon oxide film which is deposited by a chemical vapor deposition method using TEOS is used. The element isolation insulating layer 108 is deposited thickly so that the SOI layer 102 is buried.

Figure 9D:
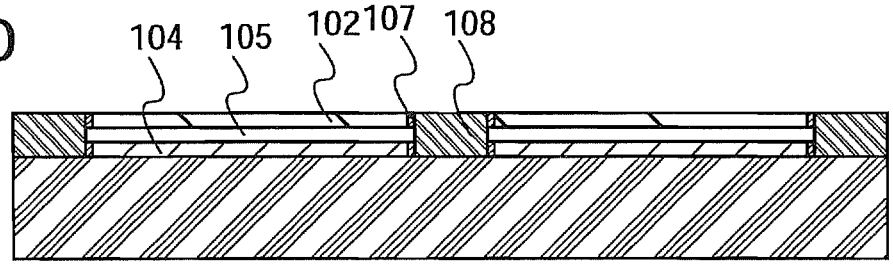

FIG. 9D shows a step of partially removing the element isolation insulating layer 108 to expose the silicon nitride layers 124. This removal step may be performed using dry etching or chemical mechanical polishing processing. The silicon nitride layer 124 functions as an etching stopper. The element isolation insulating layer 108 is left remaining to fill in a gap between the SOI layers 102. The silicon nitride layer 124 is then removed.

Figure 9E:
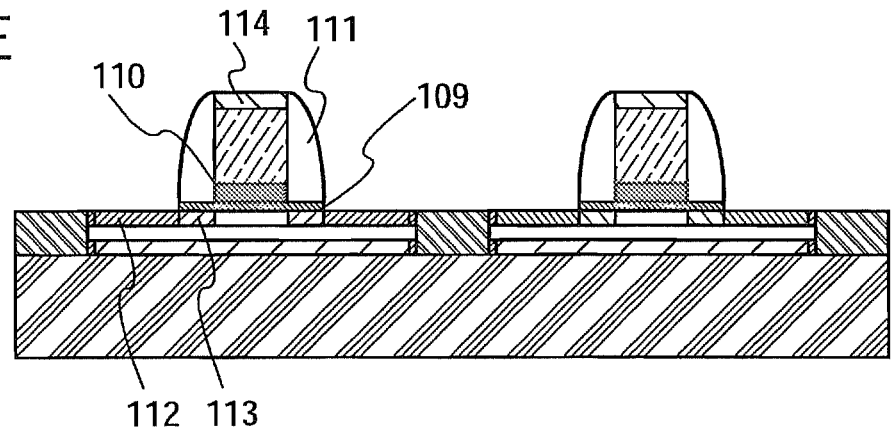

In FIG. 9E, after the SOI layer 102 is exposed, a gate insulating layer 109, a gate electrode 110, and a sidewall insulating layer 111 are formed, and a first impurity region 112 and a second impurity region 113 are formed. An insulating layer 114 is formed using a silicon nitride layer and used as a hard mask when the gate electrode 110 is etched.

Figure 10A:
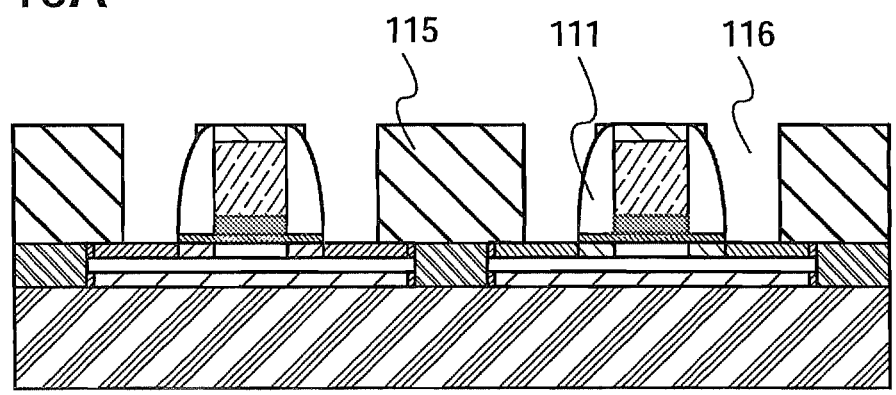
FIGS. 10A and 10B are cross-sectional views explaining a method for manufacturing a semiconductor device using an SOI substrate.

In FIG. 10A, an interlayer insulating layer 115 is formed. As the interlayer insulating layer 115, a borophosphosilicate glass (BPSG) layer is formed and then planarized by reflow. Alternatively, a silicon oxide layer may be formed using TEOS and then planarized by chemical mechanical polishing processing. In the planarizing processing, the insulating layer 114 over the gate electrode 110 functions as an etching stopper. A contact hole 116 is formed in the interlayer insulating layer 115. The contact hole 116 is formed into a self-aligned contact structure using the sidewall insulating layer 111.

Figure 10B:
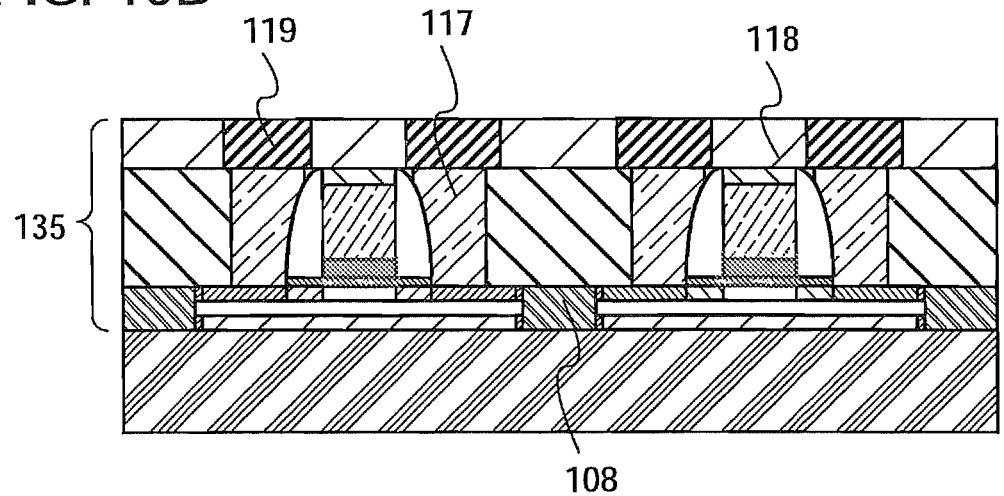

After that, as shown in FIG. 10B, a contact plug 117 is formed by a CVD method using tungsten hexafluoride. Furthermore, an insulating layer 118 is formed; an opening is formed to match the contact plug 117; and a wiring 119 is provided therein. The wiring 119 is formed of aluminum or an aluminum alloy and is provided with upper and lower metal layers of molybdenum, chromium, titanium, or the like as barrier metal layers.

Here, a stack which includes from the SOI layers 102 to the insulating layers 118 and the wirings 119 is referred to as an element layer 135.

After that, when a plurality of semiconductor devices is included in the element layer 135, the element layer 135 and the base substrate 100 may be divided and the plurality of semiconductor devices may be cut out. By such a process, a plurality of semiconductor devices can be manufactured.

In this manner, a semiconductor element, typically, a field effect transistor can be manufactured using the SOI layer 102 that is bonded to the base substrate 100. Because the SOI layer 102 according to this embodiment mode is a single-crystal semiconductor with uniform crystal orientation, a uniform and high-performance field effect transistor can be obtained. In other words, it is possible to suppress inhomogeneity of values of important transistor characteristics, such as threshold voltage and mobility, and to achieve high performance such as high mobility. Further, since the barrier layer 105 is provided between the base substrate 100 and the SOI layer 102, the SOI layer can be prevented from being contaminated by an impurity from the base substrate. Therefore, variation in characteristics of the transistors formed in the element layer can be suppressed. Furthermore, a semiconductor device which is flexible and thin can be manufactured.

(Embodiment Mode 7)

Next, a method for manufacturing a semiconductor device using an SOI substrate described in Embodiment Modes 1 to 5 will be described with reference to FIGS. 11A to 11D and FIGS. 12A and 12B. Here, a mode in which a semiconductor device is manufactured using the SOI substrate where the single-crystal semiconductor substrate and the base substrate are bonded to each other using a bonding layer 104 as shown in FIGS. 6A to 6D and FIGS. 8A to 8D will be described. The SOI substrate where the single-crystal semiconductor substrate and the base substrate are bonded to each other without the bonding layer as shown in FIGS. 5A to 5D and FIGS. 7A to 7D can also be used. A supporting substrate may be bonded to the base substrate of the SOI substrate. The SOI substrate is held by a holding member which holds the SOI substrate, whereby a semiconductor device can be manufactured with high yield even if a flexible substrate that is easily bent is used. As an example of the holding member, a roller, a gripper, or the like can be given.

Figure 11A:
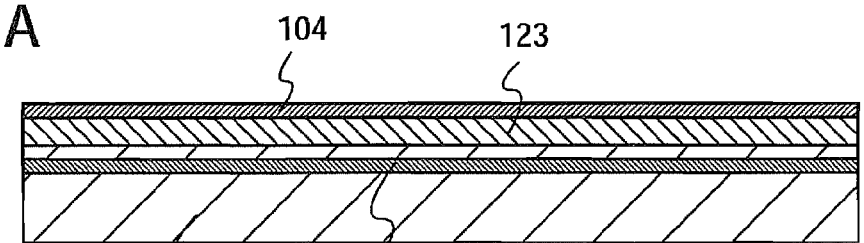
FIGS. 11A to 11D are cross-sectional views explaining a method for manufacturing a semiconductor device using an SOI substrate.

Similarly to FIG. 6A, as shown in FIG. 11A, a surface of a single-crystal semiconductor substrate 101 is irradiated with ions accelerated by an electric filed, the ions are contained at a predetermined depth of the single-crystal semiconductor substrate to form a fragile region 103. Next, a cap layer 123 and the bonding layer 104 are sequentially stacked over the surface of the single-crystal semiconductor substrate 101. After that, heating is performed and the fragile region 103 is made to be more fragile. Instead of the cap layer 123, as described in Embodiment Mode 2, after provision of a pressure member for the bonding layer 104, heating is performed and the fragile region 103 is made to be more fragile.

Figure 11B:
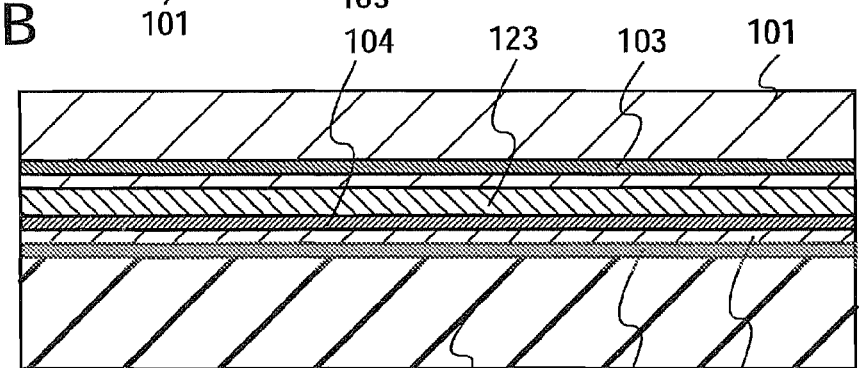

FIG. 11B shows a mode in which an insulating layer 132 formed over a supporting substrate 130 and a surface of the bonding layer 104 provided for the single-crystal semiconductor substrate 101 are bonded to each other by being disposed in contact with each other.

A separation layer 131 is formed on the supporting substrate 130 and the insulating layer 132 is formed on the separation layer 131. Next, the insulating layer 132 formed over the supporting substrate 130 and the bonding layer 104 provided for the surface of the single-crystal semiconductor substrate 101 are disposed in contact with each other and the insulating layer 132 and the bonding layer 104 are bonded to each other. The bond is formed by Van der Waals forces. By pressing the supporting substrate 130 and the single-crystal semiconductor substrate 101 against each other, a stronger bond can be formed by hydrogen bonding.

In order to form a favorable bond, at least one of the surfaces of the insulating layer 132 and the bonding layer 104 may be activated. For example, the surface that is to form a bond is irradiated with an atomic beam or an ion beam. When an atomic beam or an ion beam is used, an inert gas neutral atomic beam or inert gas ion beam of argon or the like can be used. Alternatively, plasma irradiation or radical treatment is performed. Such a surface treatment makes it possible to easily perform bonding between different kinds of materials even if temperatures of a heat treatment step is greater than or equal to 250° C. and less than 400° C.

Figure 11C:
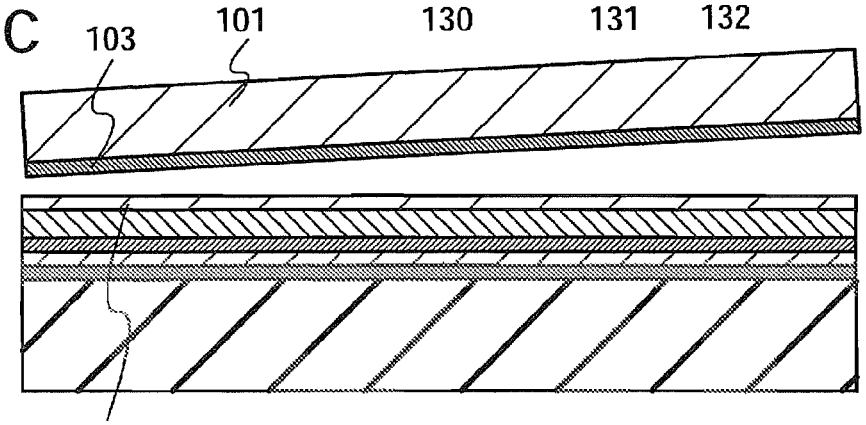
Figure 11D:
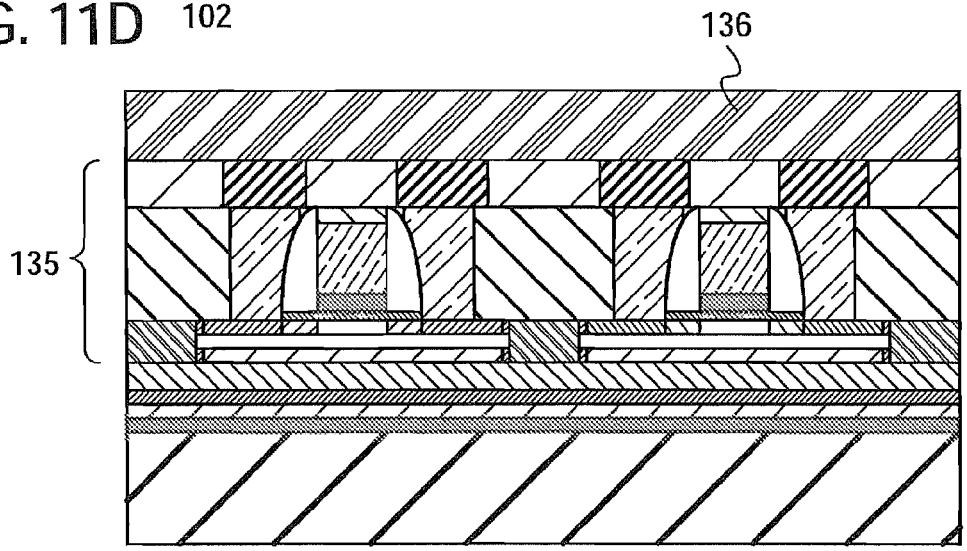

In FIG. 11C, the single-crystal semiconductor substrate 101 is bonded to the supporting substrate 130, and then the single-crystal semiconductor substrate 101 is subjected to heat treatment at 400° C. to 600° C. A crack is generated in the fragile region 103, and the single-crystal semiconductor substrate 101 is separated from the supporting substrate 130 using the fragile region 103 as a separation region. Since the bonding layer 104 is bonded to the supporting substrate 130, an SOI layer 102 having the same crystallinity as the single-crystal semiconductor substrate 101 is left remaining over the supporting substrate 130.

Note that, instead of the heat treatment, the supporting substrate 130 and the single-crystal semiconductor substrate 101 are bonded to each other, and then the single-crystal semiconductor substrate is irradiated with a laser beam from the supporting substrate 130 side, whereby the fragile region 103 may be heated. As a result, the single-crystal semiconductor substrate 101 can be separated from the supporting substrate 130 using the fragile region as a separation region.

After that, a surface of the SOI layer 102 is preferably planarized. As a planarization method, CMP can be used. Alternatively, the surface of the SOI layer 102 can be irradiated with a laser beam and melted to be planarized.

Next, through processes shown in FIGS. 9A to 9E and FIGS. 10A and 10B, an element layer 135 which includes a transistor using the SOI layer 102 is formed. Next, a base substrate 136 is provided on the element layer 135. By thermal pressure bonding of the base substrate 136 and the element layer 135, the element layer 135 can be attached firmly to the base substrate 136. Alternatively, the base substrate 136 can be attached firmly to the element layer 135 using an adhesive which is not shown (see FIG. 11D). As the base substrate 136, typical examples given as the base substrate 100 can appropriately be used as described in Embodiment Mode 1.

After that, a groove may be formed by irradiation of the element layer 135 and the separation layer 131 with a laser beam from the base substrate 136 side so that a separation process to be performed later can be conducted easily. As a laser beam used to form a groove, a laser beam having a wavelength absorbed by any of the separation layer 131 and the layers included in the element layer 135 is preferably used. Typically, a laser beam in the UV region, visible region, or infrared region is selected as appropriate for irradiation.

Figure 12A:
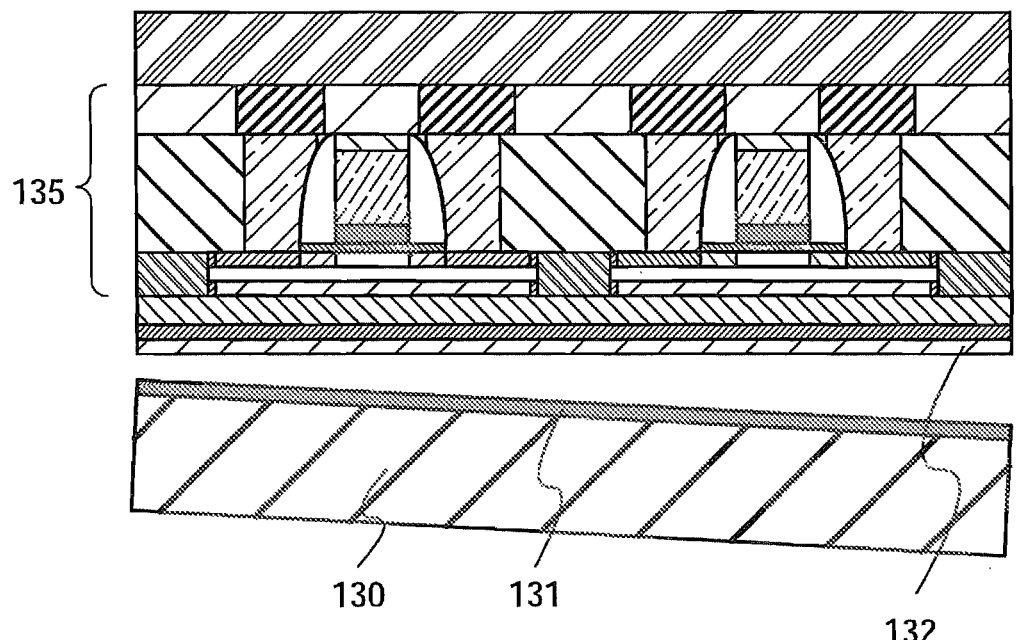
FIGS. 12A and 12B are cross-sectional views explaining a method for manufacturing a semiconductor device using an SOI substrate.

Next, as shown in FIG. 12A, the element layer 135 is separated from the supporting substrate 130 by a physical method. Alternatively, a liquid penetrates into an interface of the separation layer 131 and the insulating layer 132, and then the element layer 135 is separated from the supporting substrate 130.

Here, separation is caused at any of the interface of the separation layer 131 and the insulating layer 132, the separation layer 131 and an interface of the supporting substrate 130 and the separation layer 131, so that the element layer 135 can be separated from the supporting substrate 130.

When the element layer 135 and the base substrate 136 are separated from the supporting substrate 130, an adhesive sheet which can be separated by light or heat is provided on at least one of the surfaces of the supporting substrate 130 and the base substrate 136, one of the supporting substrate 130 and the base substrate 136 is fixed, and the other is separated, so that separation can be conducted more easily. At this time, by provision of a supporting member for the other of the supporting substrate 130 and the base substrate 136 which is not fixed, a separation process can be conducted easily.

Figure 12B:
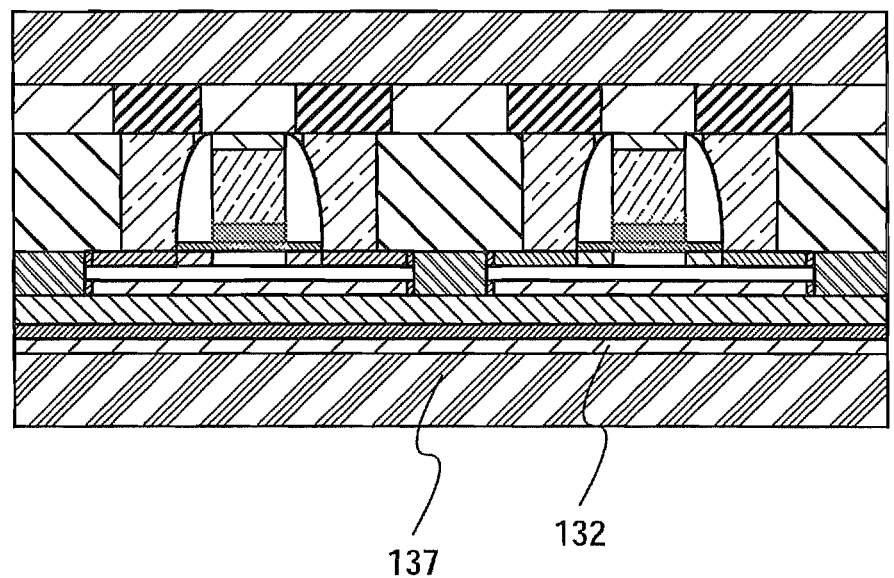

Next, as shown in FIG. 12B, a flexible substrate 137 is attached firmly to the insulating layer 132. As a material and an attaching method of the flexible substrate 137, the material and the attaching method of the base substrate 136 can be used.

After that, when a plurality of semiconductor devices are included in the element layer 135, the base substrate 136 and the flexible substrate 137 may be divided and the plurality of semiconductor devices may be cut out. By such a process, a plurality of semiconductor devices can be manufactured.

In this manner, the element layer including a field effect transistor using the SOI layer 102 which is bonded to the supporting substrate 130 is manufactured, and then a semiconductor device which is flexible and thin can be manufactured using the element layer. Since the SOI layer 102 according to this embodiment mode is a single-crystal semiconductor with uniform crystal orientation, a uniform and high-performance field effect transistor can be obtained. In other words, it is possible to suppress inhomogeneity of values of important transistor characteristics, such as threshold voltage and mobility, and to achieve high performance such as high mobility. Further, since the barrier layer 105 is provided between the base substrate 136 and the SOI layer 102, the SOI layer can be prevented from being contaminated by an impurity from the base substrate. Therefore, variation in characteristics of the transistors formed in the element layer can be suppressed.

Further, after formation of the field effect transistor using the SOI layer which is bonded to the supporting substrate, the element layer with a field effect transistor is separated from the supporting substrate, so that a semiconductor device which is flexible and thin are manufactured. Therefore, handling of the supporting substrate in a manufacturing process becomes easier and a yield can be improved.

(Embodiment Mode 8)

A semiconductor device using an SOI substrate described in Embodiment Modes 1 to 5 will be described with reference to FIGS. 13A to 13D and FIGS. 14A to 14B. Here, a mode in which a semiconductor device is manufactured using the SOI substrate where the single-crystal semiconductor substrate and the base substrate are bonded to each other using a bonding layer 104 as shown in FIGS. 6A to 6D and FIGS. 8A to 8D will be described. The SOI substrate where the single-crystal semiconductor substrate and the base substrate are bonded to each other without the bonding layer as shown in FIGS. 5A to 5D and FIGS. 7A to 7D can also be used. A supporting substrate may be bonded to the base substrate side of the SOI substrate. The SOI substrate is held by a holding member which holds the SOI substrate, whereby a semiconductor device can be manufactured with high yield even if a flexible substrate that is easily bent is used. As an example of the holding member, a roller, a gripper, or the like can be given.

Figure 13A:
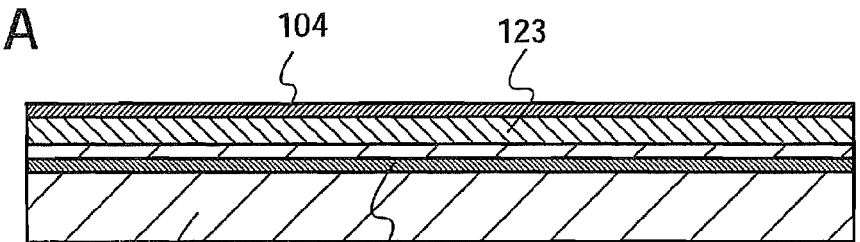
FIGS. 13A to 13D are cross-sectional views explaining a method for manufacturing a semiconductor device using an SOI substrate.

Similarly to FIG. 6A, as shown in FIG. 13A, a single-crystal semiconductor substrate 101 is irradiated with ions accelerated by an electric filed from a surface thereof, the ions are contained at a predetermined depth of the single-crystal semiconductor substrate to form a fragile region 103. Next, a cap layer 123 and a bonding layer 104 are sequentially stacked over the surface of the single-crystal semiconductor substrate 101. Next, heat treatment is performed to the single-crystal semiconductor substrate 101 at temperatures of greater than or equal to 250° C., preferably greater than or equal to 300° C. and less than 400° C., more preferably less than 350° C., so that the fragile region 103 is made to be more fragile. Here, since the cap layer 123 is formed on the surface of the single-crystal semiconductor substrate 101, the fragile region 103 can be made to be more fragile with flatness of the surfaces of the single-crystal semiconductor substrate 101 and the bonding layer 104 kept.

Figure 13B:
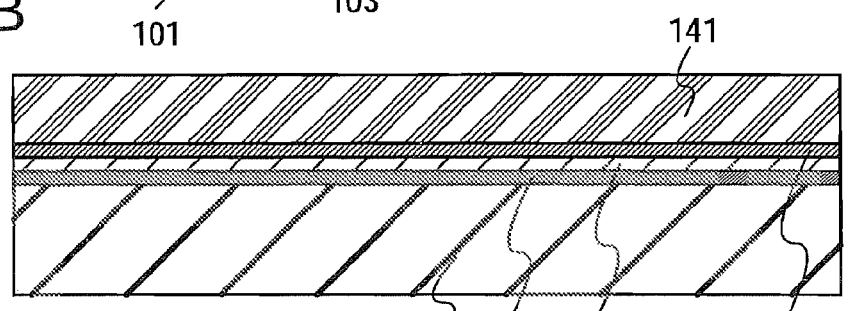

As shown in FIG. 13B, a separation layer 131 is formed on a supporting substrate 130 and an insulating layer 132 is formed on the separation layer 131. Further, a bonding layer 140 is formed on a flexible substrate 141. Next, the insulating layer 132 and the bonding layer 140 provided for the flexible substrate 141 are bonded to each other by being disposed in contact with each other, so that the supporting substrate 130 and the flexible substrate 141 are bonded to each other.

Figure 13C:
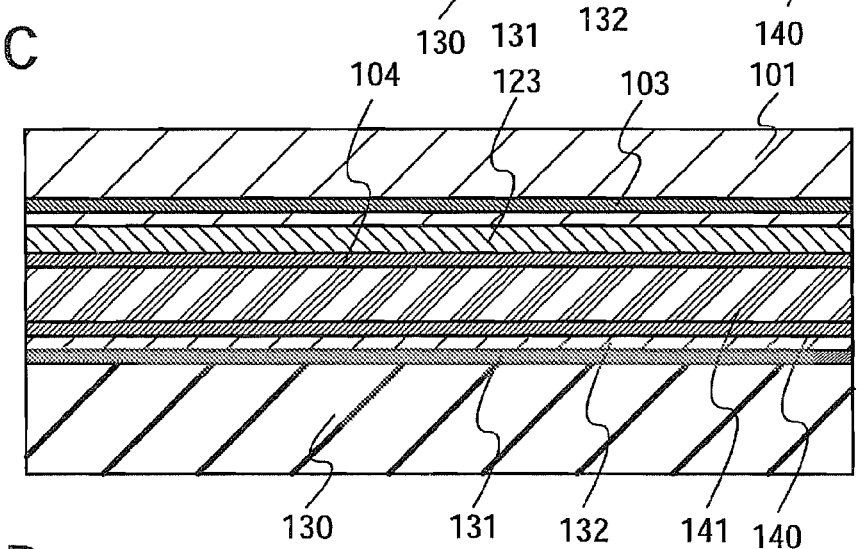

Next, as shown in FIG. 13C, the flexible substrate 141 and the bonding layer 104 formed over the single-crystal semiconductor substrate 101 are bonded to each other by being disposed in contact with each other, so that the flexible substrate 141 and the single-crystal semiconductor substrate 101 are bonded to each other.

In order to form a favorable bond, at least one of the surfaces of the flexible substrate 141 and the bonding layer 104 may be activated. For example, the surface that is to form a bond is irradiated with an atomic beam or an ion beam. When an atomic beam or an ion beam is used, an inert gas neutral atomic beam or inert gas ion beam of argon or the like can be used. Alternatively, plasma irradiation or radical treatment is performed. Further, at least one of bonding surfaces of the flexible substrate having an insulating surface and the single-crystal semiconductor substrate may be subjected to treatment by oxygen plasma or washing with ozone water to be hydrophilic. Such a surface treatment makes it possible to easily perform bonding between different kinds of materials even if temperatures of a heat treatment step is greater than or equal to 250° C. and less than 400° C.

Figure 13D:
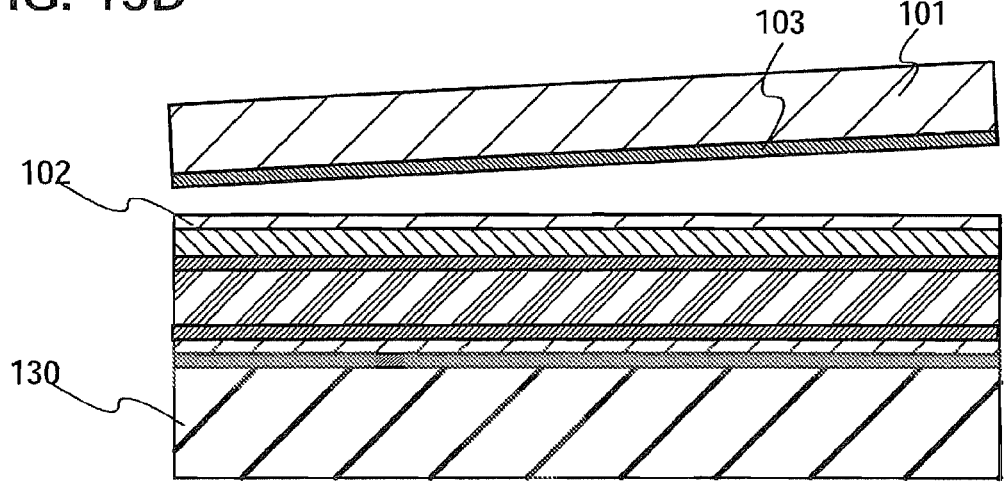

In FIG. 13D, the single-crystal semiconductor substrate 101 is separated from the supporting substrate 130 and the flexible substrate 141 using the fragile region 103 as a separation region. Since the bonding layer 104 is bonded to the supporting substrate 130, an SOI layer 102 having the same crystallinity as the single-crystal semiconductor substrate 101 is left remaining over the supporting substrate 130.

Note that, instead of heat treatment which is performed before bonding the single-crystal semiconductor substrate 101 to the flexible substrate 141, the single-crystal semiconductor substrate 101 may be irradiated with a laser beam from the single-crystal semiconductor substrate 101 side after bonding the single-crystal semiconductor substrate 101 to the flexible substrate 141 and the fragile region 103 may be heated. As a result, the single-crystal semiconductor substrate 101 can be separated from the flexible substrate 141 using the fragile region as a separation region.

After that, a surface of the SOI layer 102 is preferably planarized. As a planarization method, CMP can be used. Alternatively, the surface of the SOI layer 102 can be irradiated with a laser beam and melted to be planarized.

Before the single-crystal semiconductor substrate 101 is separated from the supporting substrate 130 using the fragile region 103 as a separation region, a trigger may be made so that separation can be conducted easily. When the single-crystal semiconductor substrate 101 is separated from the supporting substrate 130, an adhesive sheet which can be separated by light or heat is provided on at least one of the surfaces of the supporting substrate 130 and the single-crystal semiconductor substrate 101, one of the supporting substrate 130 and the single-crystal semiconductor substrate 101 is fixed, and the other is separated, so that separation can be conducted more easily. At this time, by provision of a supporting member for the other of the supporting substrate 130 and the single-crystal semiconductor substrate 101 which is not fixed, a separation process can be conducted easily.

Next, through the processes described in FIGS. 9A to 9E and FIGS. 10A to 10B, an element layer 135 including a transistor using the SOI layer 102 is formed. Next, a flexible substrate 142 is provided on the element layer 135. By thermal pressure bonding of the flexible substrate 142 and the element layer 135, the flexible substrate 142 can be attached firmly to the element layer 135. Alternatively, the flexible substrate 142 can be attached firmly to the element layer 135 using an adhesive which is not shown (see FIG. 14A). As the flexible substrate 142, typical examples given as the base substrate 100 can appropriately be used as described at Embodiment Mode 1.

Figure 14A:
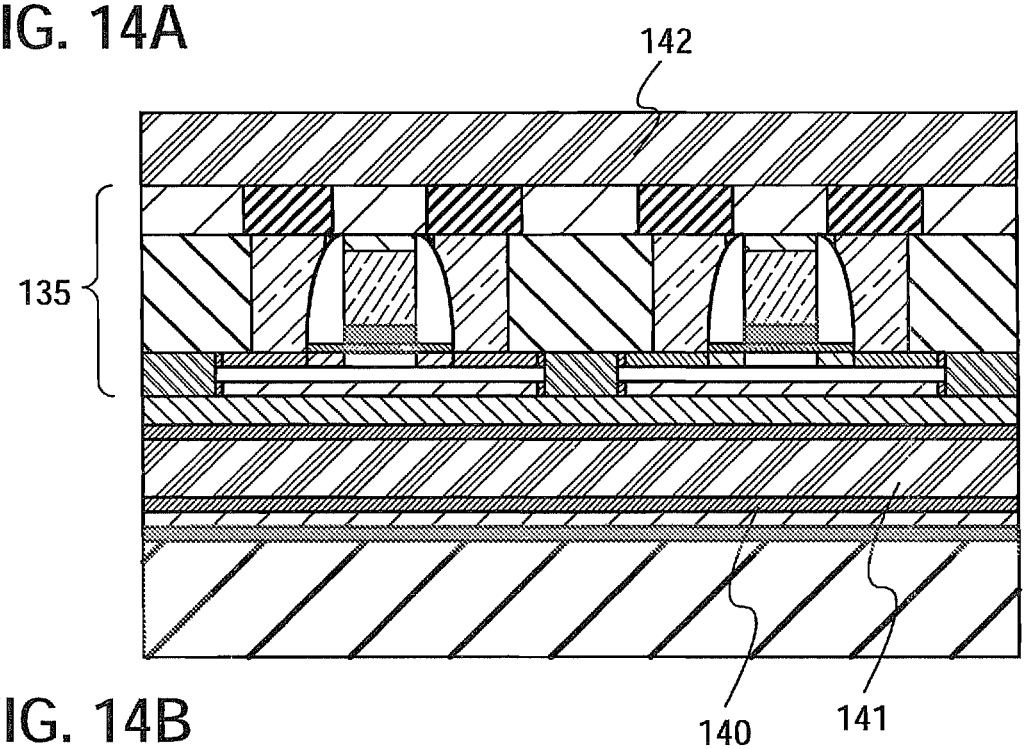
FIGS. 14A and 14B are cross-sectional views explaining a method for manufacturing a semiconductor device using an SOI substrate.
Figure 14B:
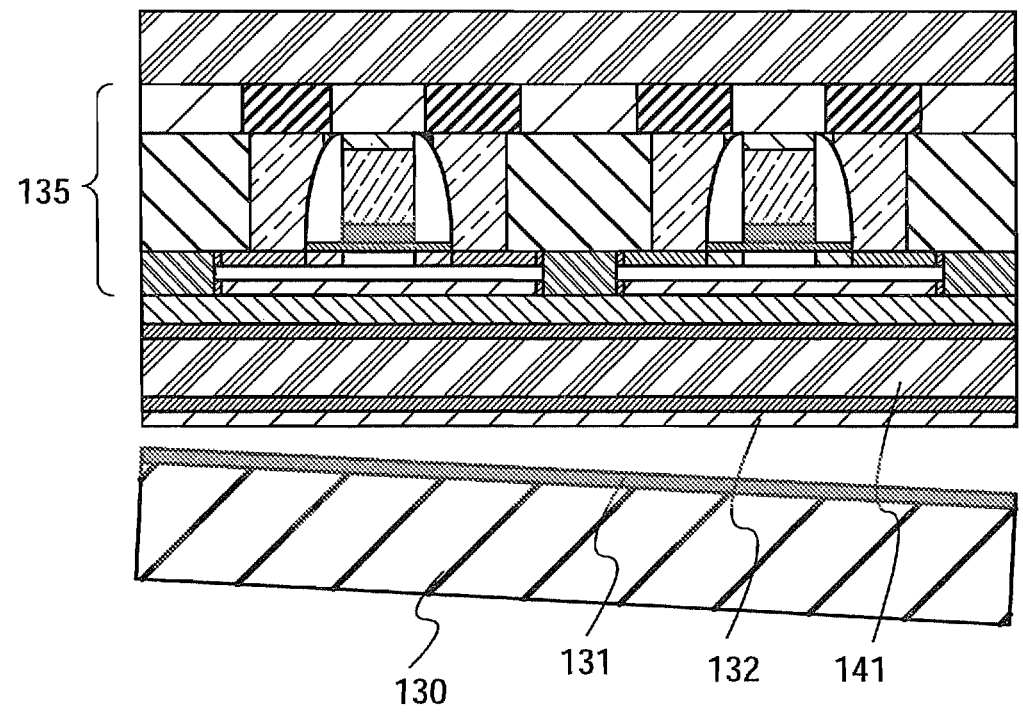

Next, as shown in FIG. 14B, a stack including the flexible substrate 141, the element layer 135 and the flexible substrate 142 is separated from the supporting substrate 130 by a physical method. Alternatively, a liquid is penetrated into an interface of the separation layer 131 and the insulating layer 132, and then the stack including the flexible substrate 141, the element layer 135 and the flexible substrate 142 is separated from the supporting substrate 130.

Here, separation is caused at any of the interface of the separation layer 131 and the insulating layer 132, the separation layer 131 and an interface of the supporting substrate 130 and the separation layer 131, so that the element layer 135 can be separated from the supporting substrate 130.

Before the element layer 135 and the flexible substrate 142 are separated from the supporting substrate 130 at the separation layer 131, a trigger may be made so that separation can be conducted easily. When the element layer 135 and the flexible substrate 142 are separated from the supporting substrate 130, an adhesive sheet which can be separated by light or heat is provided on at least one of the surfaces of the supporting substrate 130 and the flexible substrate 142, one of the supporting substrate 130 and the flexible substrate 142 is fixed, and the other is separated, so that separation can be conducted more easily. At this time, by provision of a supporting member for the other of the supporting substrate 130 and the flexible substrate 142 which is not fixed, a separation process can be conducted easily.

After that, when a plurality of semiconductor devices is included in the element layer 135, the element layer 135 and the flexible substrates 141 and 142 may be divided and a plurality of semiconductor devices may be cut out. By such a process, a plurality of semiconductor devices can be manufactured.

Further, after formation of the field effect transistor using the SOI layer which is bonded to the supporting substrate, the element layer with a field effect is separated from the supporting substrate, so that a semiconductor device which is flexible and thin is manufactured. Therefore, handling of the supporting substrate in a manufacturing process becomes easier and a yield can be improved.

In this manner, a field effect transistor can be manufactured using the SOI layer 102 that is bonded to the flexible substrate 141. Because the SOI layer 102 according to this embodiment mode is a single-crystal semiconductor with uniform crystal orientation, a uniform and high-performance field effect transistor can be obtained. In other words, it is possible to suppress inhomogeneity of values of important transistor characteristics, such as threshold voltage and mobility, and to achieve high performance such as high mobility. Further, since the barrier layer 105 is provided between the base substrate 100 and the SOI layer 102, the SOI layer can be prevented from being contaminated by an impurity from the base substrate. Therefore, variation in characteristics of the transistors formed in the element layer can be suppressed. Furthermore, a semiconductor device which is flexible and thin can be manufactured.

(Embodiment Mode 9)

Figure 15:
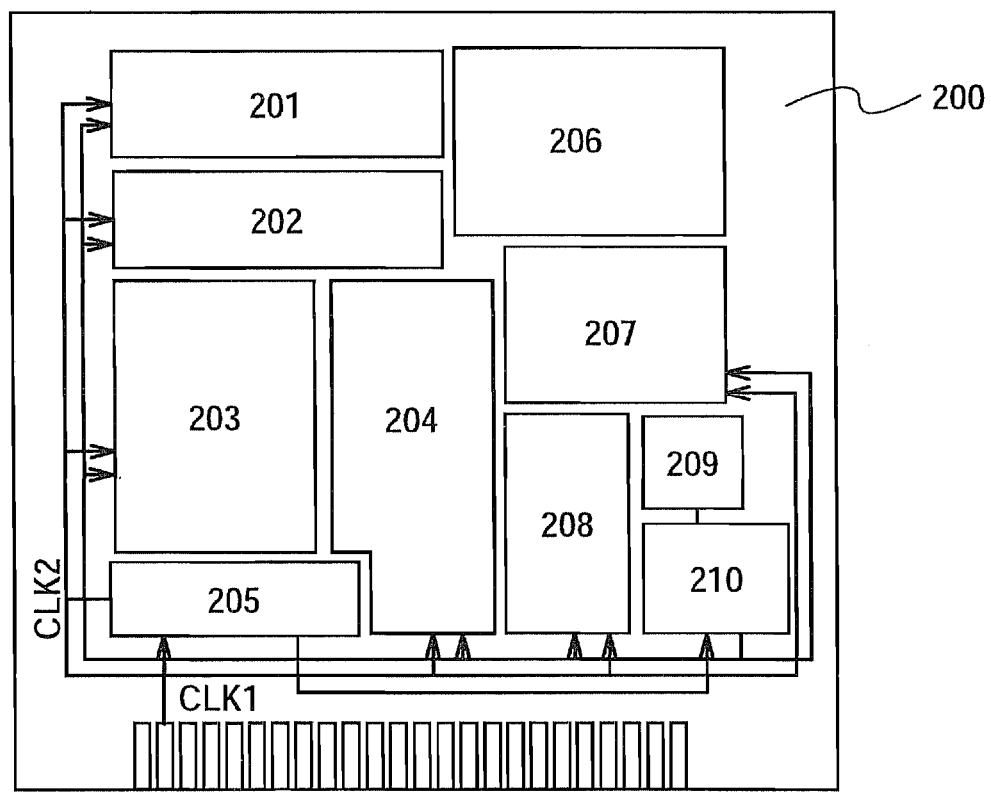
FIG. 15 is a block diagram showing a structure of a microprocessor obtained using an SOI substrate.

FIG. 15 shows a structure of a microprocessor manufactured using the SOI substrate shown Embodiment Modes 1 to 5 as an example of semiconductor devices shown in Embodiment Modes 6 to 8. This microprocessor 200 has an arithmetic logic unit (ALU) 201, an ALU controller 202, an instruction decoder 203, an interrupt controller 204, a timing controller 205, a register 206, a register controller 207, a bus interface (Bus I/F) 208, a read-only memory (ROM) 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the internal clock signal CLK2 to the various above-mentioned circuits. Obviously, the microprocessor 200 shown in FIG. 15 is only an example in which the configuration is simplified and an actual microprocessors may have various configurations depending on the uses.

The above-described microprocessor 200 can achieve not only an increase in processing speed but also a reduction in power consumption because an integrated circuit is formed using a single-crystal semiconductor layer (SOI layer) with uniform crystal orientation which is bonded to a flexible substrate having an insulating surface.

(Embodiment Mode 10)

Figure 16:
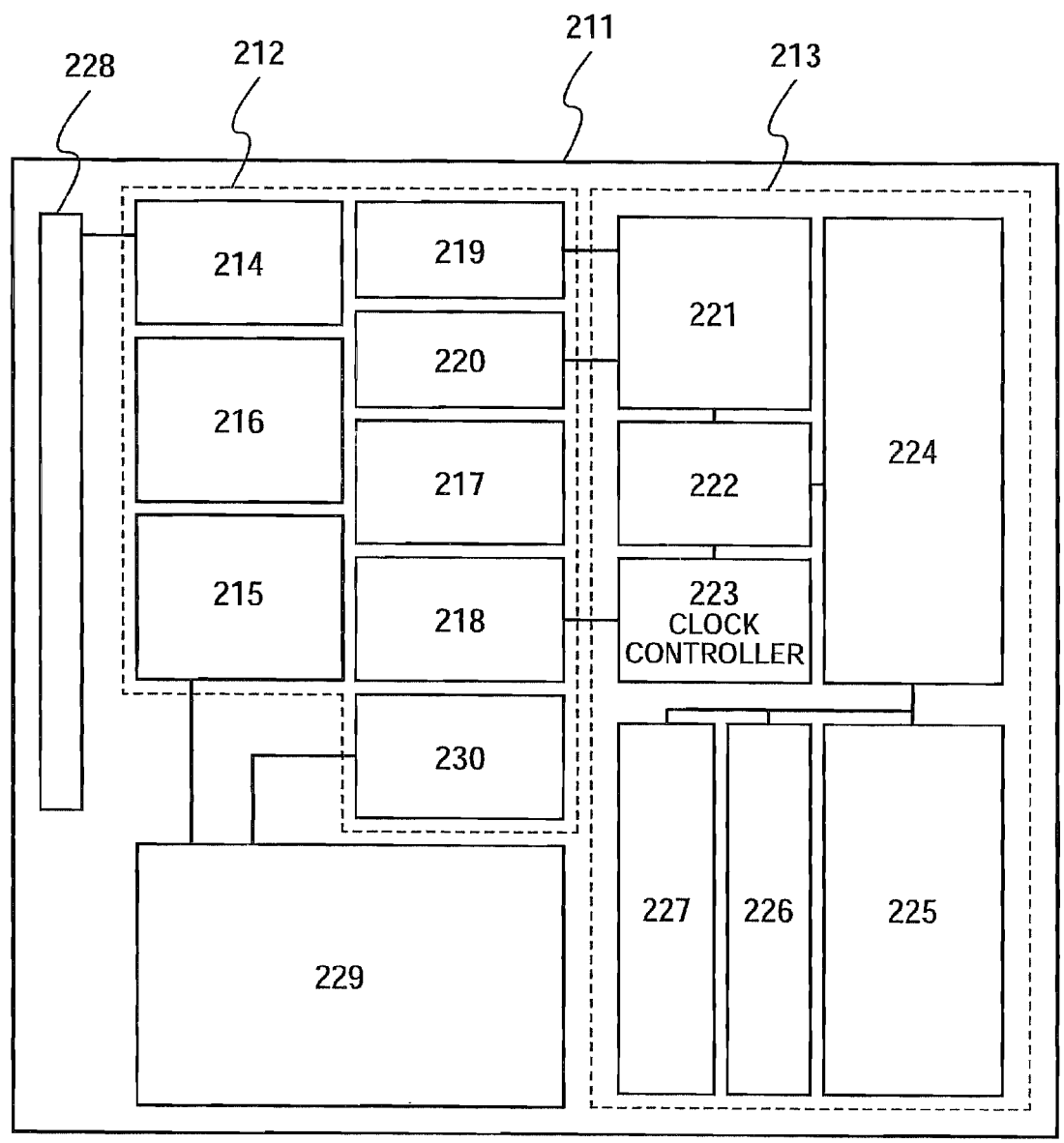
FIG. 16 is a block diagram showing a structure of an RFCPU obtained using an SOI substrate.

Next, a structure of an RFCPU obtained using the SOI substrate shown in Embodiment Modes 1 to 5 is described with reference to FIG. 16 as an example of semiconductor devices having an arithmetic function that enable contactless data transmission and reception, shown in Embodiment Modes 6 to 8. FIG. 16 shows an example of a computer that operates to transmit and receive signals to and from an external device by wireless communication (such a computer is hereinafter referred to as an RFCPU). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 has an RF interface 221, a control register 222, a clock controller 223, an interface (a CPU interface) 224, a central processing unit (CPU) 225, a random-access memory (RAM) 226, and a read-only memory (ROM) 227.

The operation of the RFCPU 211 having such a configuration is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 is mounted as a different component on a substrate having an insulating surface which is included in the RFCPU 211.

The reset circuit 217 generates a signal for resetting and initializing the digital circuit portion 213. For example, the reset circuit 217 generates a signal which rises after rise in the power supply voltage with delay as a reset signal. The oscillator circuit 218 changes the frequency and duty ratio of a clock signal in response to a control signal generated by the constant voltage circuit 216. The demodulator circuit 219 formed using a low-pass filter binarizes the amplitude of, for example, a received amplitude-modulated (ASK) signal. The modulator circuit 220 varies the amplitude of an amplitude-modulated (ASK) transmission signal and transmits the signal. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is monitored by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the interface 224. The interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit 225 using a program.

The above-described RFCPU 211 can achieve not only an increase in processing speed but also a reduction in power consumption because an integrated circuit is formed using a single-crystal semiconductor layer (SOI layer) with uniform crystal orientation which is bonded to a flexible substrate having an insulating surface. This makes it possible to ensure the operation for a long period of time even when the capacitor portion 229 which supplies power is downsized.

(Embodiment Mode 11)

Next, a structure of a display panel obtained using the SOI substrate described in Embodiment Modes 1 to 5 will be described as an example of semiconductor devices described in Embodiment Modes 6 to 8, with reference to FIG. 17.

SOI layers 102 exemplified in Embodiment Modes 1 to 5 can be bonded to a large flexible substrate with which a display panel is manufactured. FIG. 17 shows a case in which SOI layers 102 are bonded to a base substrate 100 which is a large-sized flexible substrate having an insulating surface. Since a plurality of display panels are cut out from the large-sized flexible substrate having an insulating surface, the SOI layers 102 are preferably bonded to formation regions of display panels 231 in the base substrate 100. Since the flexible large-sized substrate having an insulating surface has a larger area than a single-crystal semiconductor substrate, a plurality of the SOI layers 102 are preferably arranged as shown in FIG. 17. The display panel 231 includes a scanning line driver circuit region 232, a signal line driver circuit region 233 and a pixel formation region 234. The SOI layer 102 is bonded to the base substrate 100 which is the large-sized flexible substrate having an insulating surface, so that the scanning line driver circuit region 232, the signal line driver circuit region 233 and the pixel formation region 234 are included.

Figure 18A:
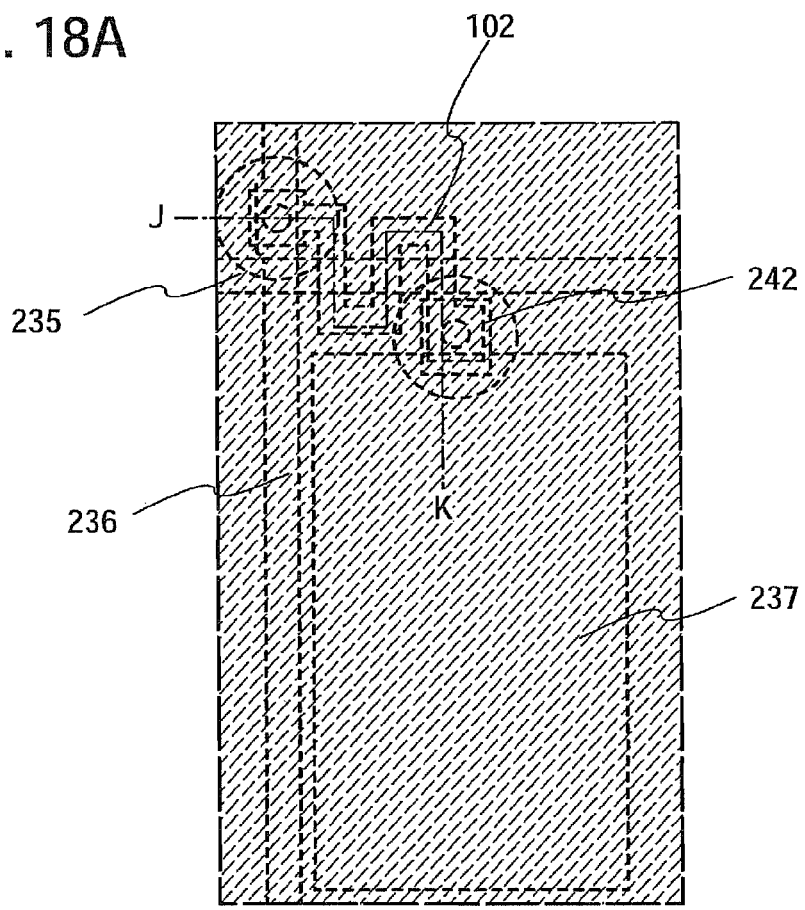
FIGS. 18A and 18B are views showing an example of a display panel including a pixel transistor using an SOI layer.
Figure 18B:
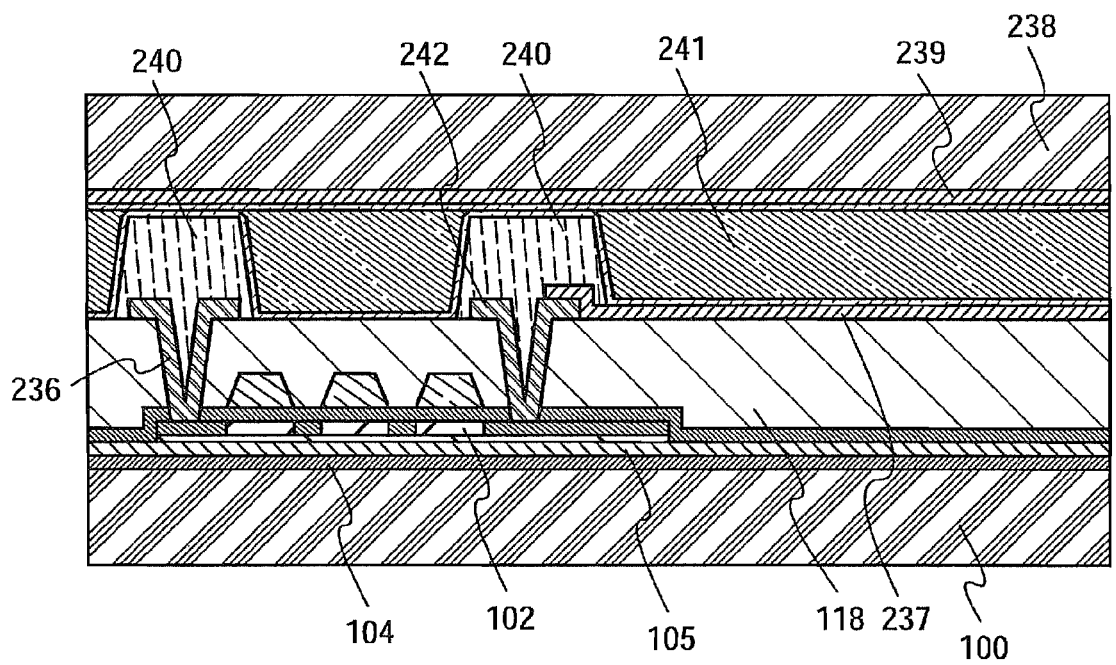

FIGS. 18A and 18B show an example of a pixel of the display panel in which a pixel transistor is formed using the SOI layer 102. FIG. 18A is a plane view of the pixel. In a pixel formed over the SOI layer, a gate wiring 235 and a source wiring 236 which intersect with each other are formed. The source wiring 236 and a drain electrode 242 are connected to the SOI layer 102, and a pixel electrode 237 is connected to the drain electrode 242. FIG. 18B is a cross sectional view taken along a line J-K in FIG. 18A.

In FIG. 18B, a silicon nitride layer and a silicon oxide layer are stacked as a barrier layer 105 over the base substrate 100. The SOI layer 102 is bonded to the base substrate 100 which is flexible and has an insulating surface by a bonding layer 104. A pixel electrode 237 is provided over an insulating layer 118. Columnar spacers 240 are provided so as to fill concave step portions in contact holes for connecting the SOI layers 102 and the source wirings 236. A counter substrate 238 is provided with a counter electrode 239 and liquid crystal layers 241 are formed in spaces formed by the columnar spacers 240.

In this manner, the SOI layers are formed over the flexible large-sized substrate having an insulating surface with which the display panel is manufactured and the transistors using the SOI layers can be formed. Since the transistors formed using the SOI layers are more excellent in all the operating characteristics such as a current driving capability than those of amorphous silicon transistors, the size of the transistors can be reduced. Accordingly, an aperture ratio of the pixel in the display panel can be improved. Further, since a microprocessor described in FIG. 15 can also be formed, the display panel can have a function of a computer. A display in which data can be input and output in a non-contact manner can also be manufactured.

(Embodiment Mode 12)

An ion irradiation method, which is one aspect of the present invention, is considered below.

In the present invention, a single-crystal semiconductor substrate is irradiated with ions that are derived from hydrogen (H) (hereafter referred to as "hydrogen ion species"). More specifically, a hydrogen gas or a gas which contains hydrogen in its composition is used as a source material; a hydrogen plasma is generated; and a single-crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 19:
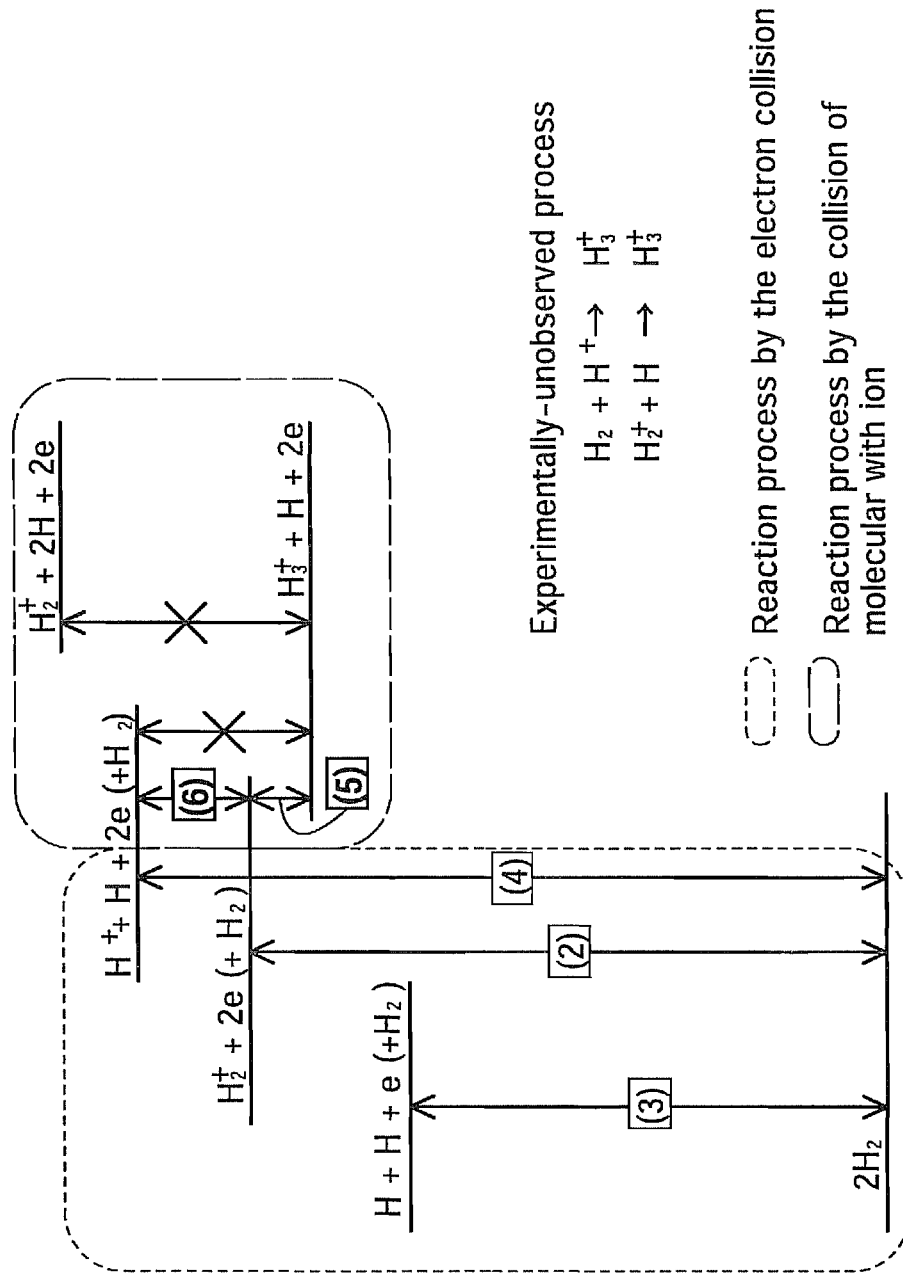
FIG. 19 is an energy diagram of hydrogen ion species.

FIG. 19 is an energy diagram which schematically shows some of the above reactions. Note that the energy diagram shown in FIG. 19 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field and the charged particle gains kinetic energy. The kinetic energy corresponds to the amount of decrease in potential energy due to an electric field. For example, the amount of kinetic energy a given charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 20:
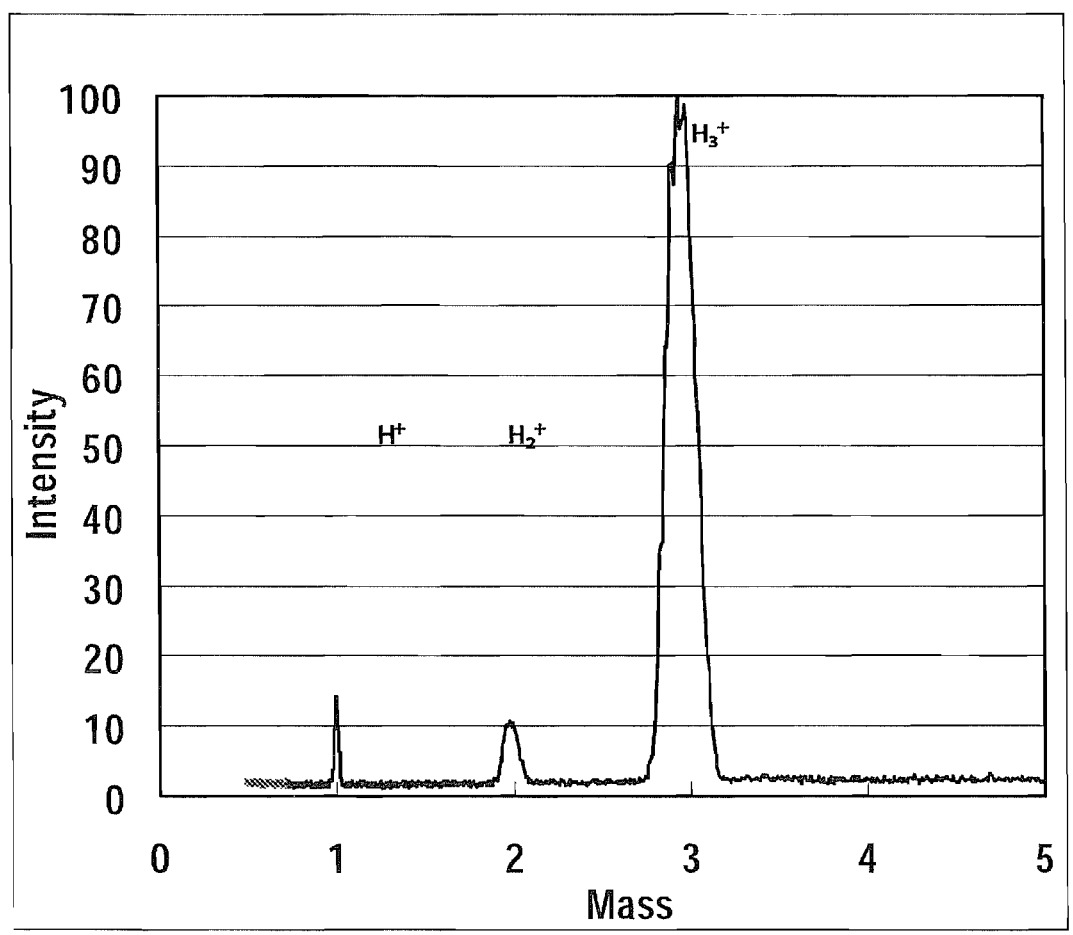
FIG. 20 is a diagram showing the results of ion mass spectrometry.

Here, an example, in which the proportions of ion species (particularly, the proportion of $H_3^+$) are different, is described. FIG. 20 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 20, the number of ions with different masses is expressed as a relative proportion where the number of ions with a mass of 3 is defined as 100. It can be seen from FIG. 20 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 21:
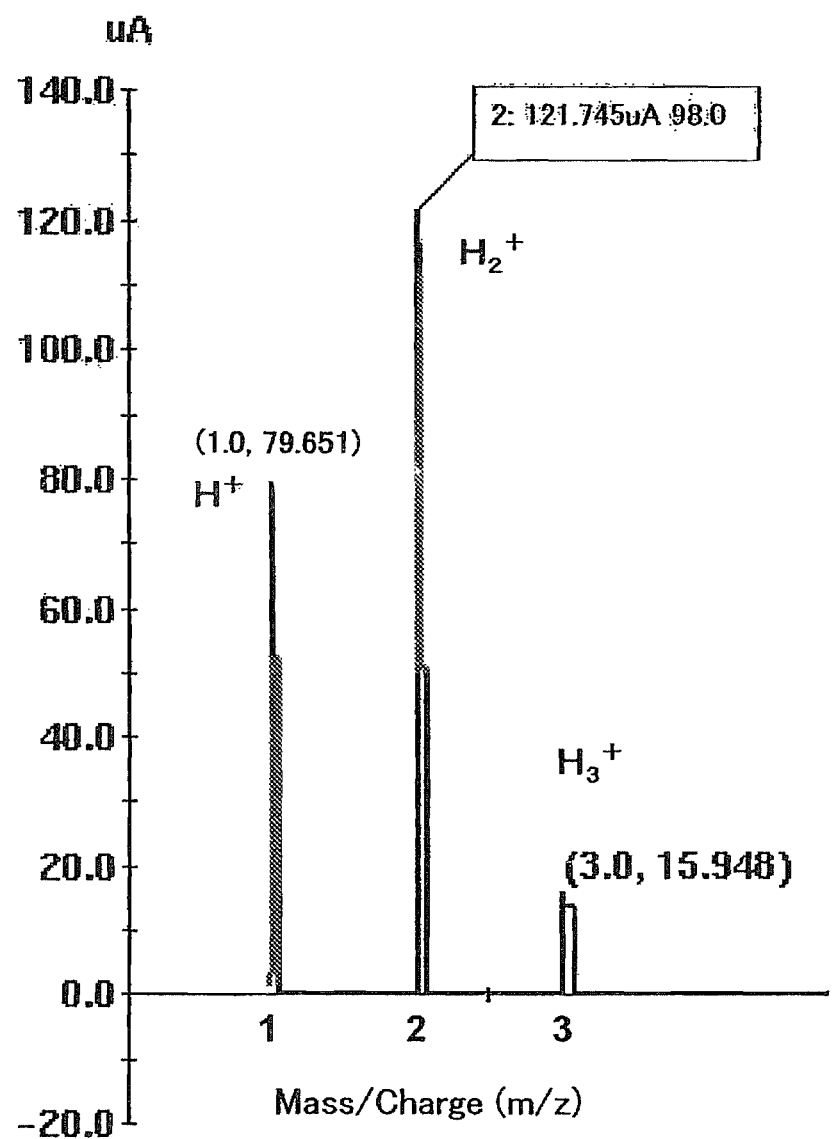
FIG. 21 is a diagram showing the results of ion mass spectrometry.

FIG. 21 is a graph showing the results of mass spectrometry of ions that are generated from $PH_3$ when an ion source different from that for the case of FIG. 20 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 20, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 21 that the ratio between ion species in a plasma, i.e., the ratio between $H^+$, $H_2^+$, and $H_3^+$, is about 37:56:7. Note that, although FIG. 21 shows the data obtained when the source gas is $PH_3$, the ratio between the hydrogen ion species is about the same when a 100% hydrogen gas is used as a source gas, as well.

In the case of the ion source from which the data shown in FIG. 21 is obtained, $H_3^+$, of $H_2^+$, and $H_3^+$ is generated at a proportion of only about 7%. On the other hand, in the case of the ion source from which the data shown in FIG. 20 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 20 is generated and a single-crystal semiconductor substrate is irradiated with the generated ion species without any mass separation being performed, the surface of the single-crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 22:
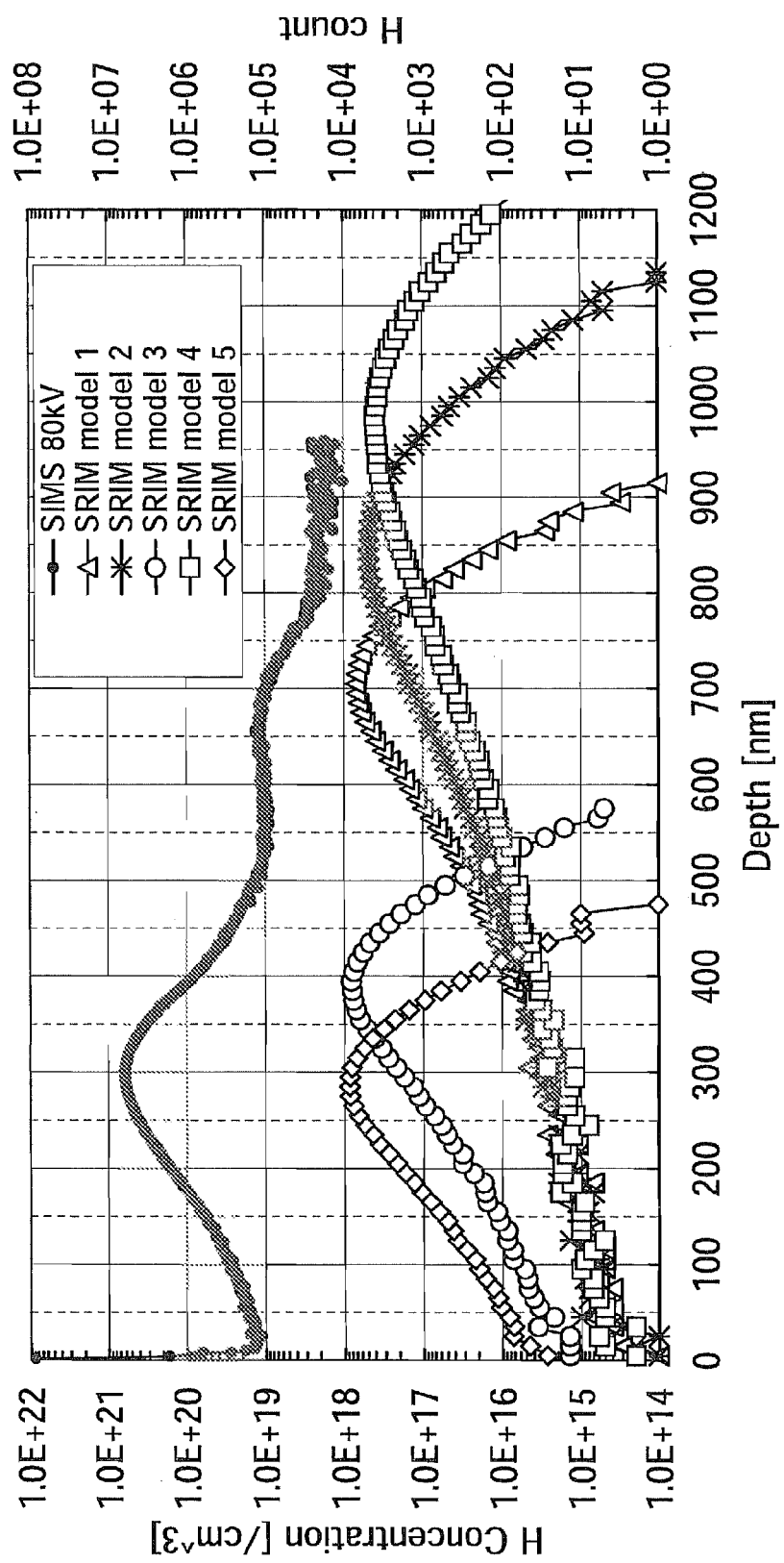
FIG. 22 is a diagram showing the profile (measured values and calculated values) of hydrogen in the depth direction when the accelerating voltage is 80 kV.

FIG. 22 shows the calculation results obtained when irradiation with the hydrogen ion species (irradiation with 100,000 atoms for H) is performed using Models 1 to 5. FIG. 22 also shows the hydrogen concentration (secondary ion mass spectroscopy (SIMS) data) in an Si substrate irradiated with the hydrogen ion species of FIG. 20. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 23:
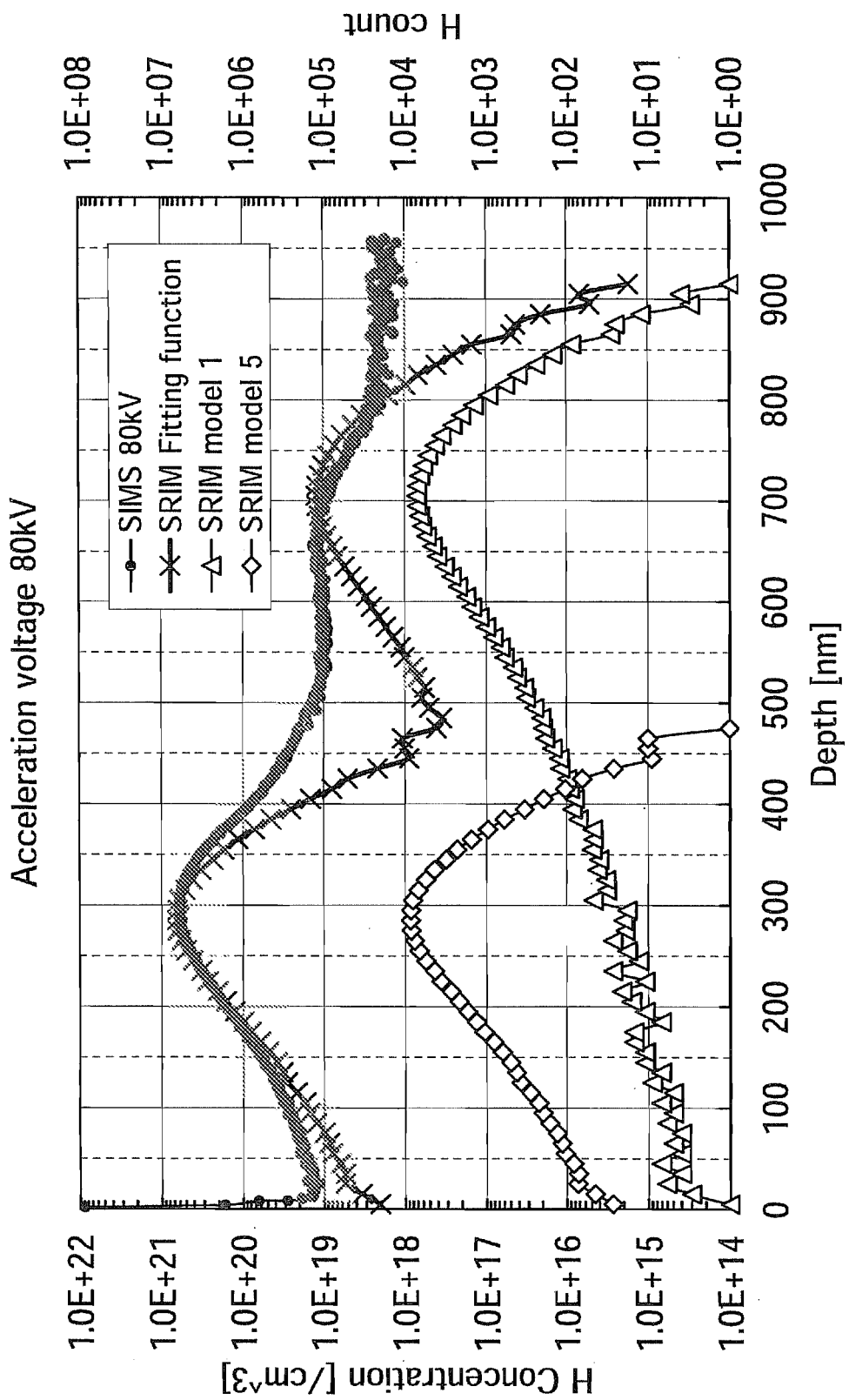
FIG. 23 is a diagram showing the profile (measured values, calculated values, and fitting functions) of hydrogen in the depth direction when the accelerating voltage is 80 kV.
Figure 24:
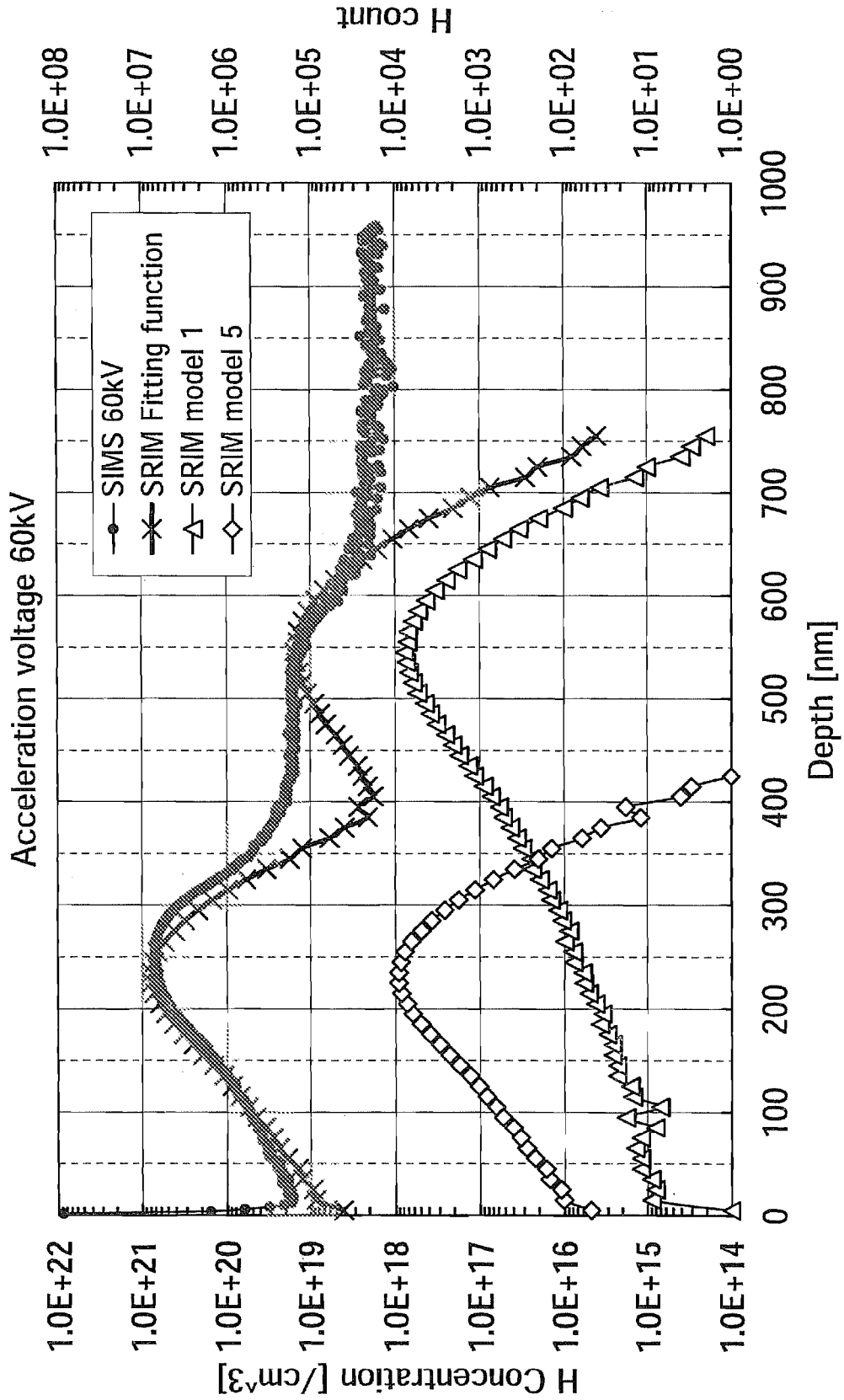
FIG. 24 is a diagram showing the profile (measured values, calculated values, and fitting functions) of hydrogen in the depth direction when the accelerating voltage is 60 kV.
Figure 25:
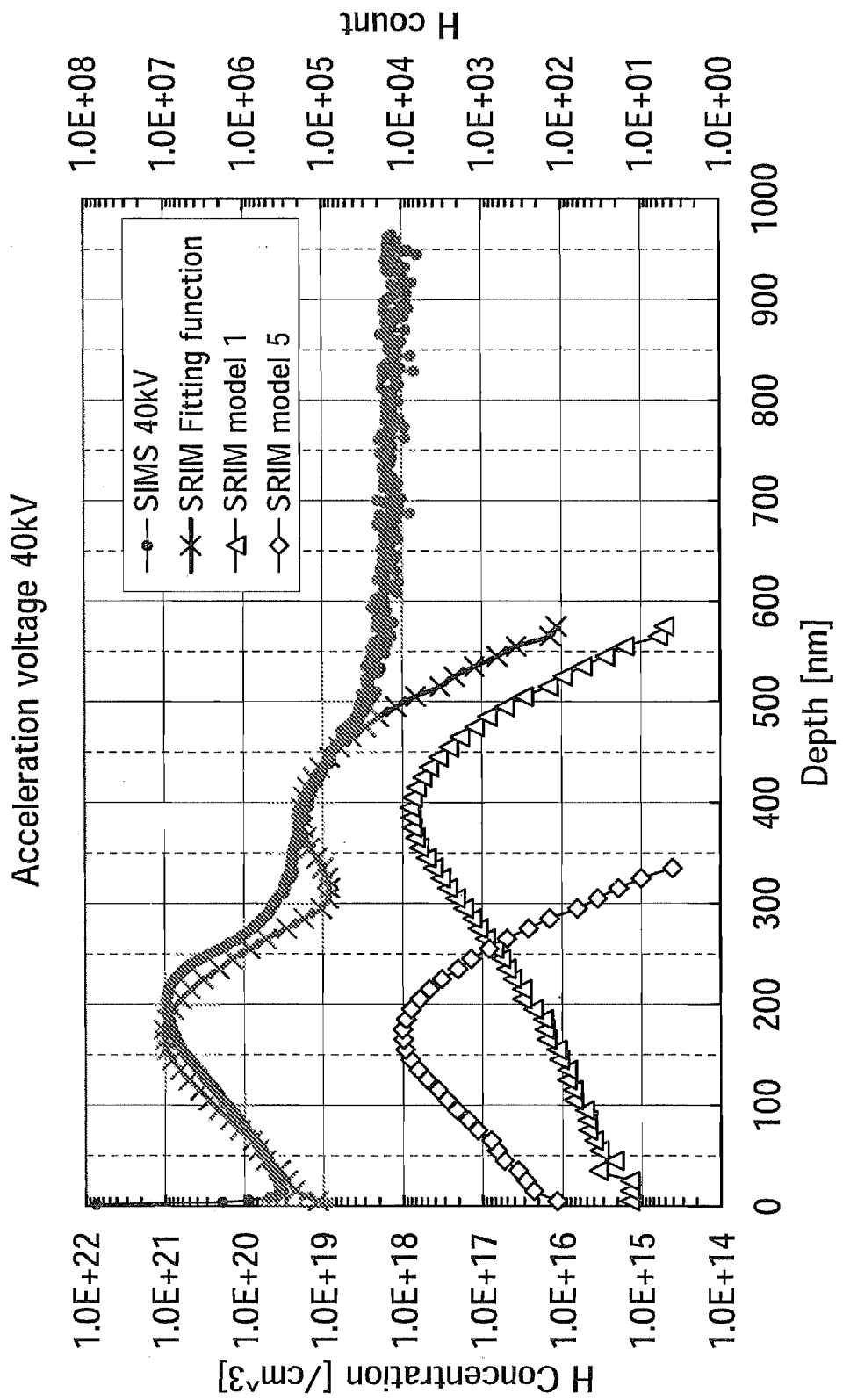
FIG. 25 is a diagram showing the profile (measured values, calculated values, and fitting functions) of hydrogen in the depth direction when the accelerating voltage is 40 kV.

Accordingly, Models 2 to 4 will not be considered hereinafter. FIGS. 23 to 25 each show the calculation results obtained when irradiation with the hydrogen ion species (irradiation with 100,000 atoms for H) is performed using Models 1 and 5. FIGS. 23 to 25 also each show the hydrogen concentration (SIMS data) in an Si substrate irradiated with the hydrogen ion species of FIG. 20, and the simulation results fitted to the SIMS data (hereinafter referred to as a fitting function). Here, FIG. 23 shows the case where the accelerating voltage is 80 kV; FIG. 24, the case where the accelerating voltage is 60 kV; and FIG. 25, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that, in the calculation formula, X and Y represent fitting parameters and V represents volume.

$$\text{(Fitting Function)} = X/V \times (\text{Data of Model 1}) + Y/V \times (\text{Data of Model 5})$$

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 26 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 20. For example, because $H_3^+$ splits into $H^+$, H, or the like to be introduced into a substrate, ion introduction efficiency can be improved compared with the case of irradiation mainly with $H^+$ or $H_2^+$. This leads to an improvement in an SOI substrate production efficiency. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species as shown in FIG. 20 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion doping apparatus.

This application is based on Japanese Patent Application serial no. 2007-112239 filed with Japan Patent Office on Apr. 20, 2007, the entire contents of which are hereby incorporated by reference.

What is claimed is:

1. A method for manufacturing a device, comprising:
   forming a semiconductor element using a single-crystal semiconductor layer over a first substrate, wherein an insulating layer is located between the single-crystal semiconductor layer and the first substrate;
   attaching the first substrate and a second substrate with the semiconductor element therebetween;
   separating the first substrate from the second substrate such that the semiconductor element is left over the second substrate; and
   attaching a third substrate and the second substrate with the semiconductor element therebetween.

2. The method for manufacturing a device according to claim 1,
   wherein a separation layer is located between the first substrate and the insulating layer, and
   wherein the separation layer comprises one material selected from the group consisting of tungsten, molybdenum, titanium, tantalum, niobium, nickel, cobalt, zirconium, zinc, ruthenium, rhodium, palladium, osmium and iridium.

3. The method for manufacturing a device according to claim 1, wherein the insulating layer is silicon oxide formed by a chemical vapor deposition using an organic silane.

4. The method for manufacturing a device according to claim 1, wherein the second substrate is flexible.

5. The method for manufacturing a device according to claim 1, wherein the single-crystal semiconductor layer is a single-crystal layer of one selected from the group consisting of silicon, germanium, silicon germanium, gallium arsenide and indium phosphide.

6. The method for manufacturing a device according to claim 1, wherein the attaching is conducted by thermal pressure bonding.

7. The method for manufacturing a device according to claim 2, wherein a groove is formed from the second substrate to the separation layer.

8. The method for manufacturing a device according to claim 1, wherein the third substrate is flexible.

9. A method for manufacturing a device, comprising:
   forming a semiconductor element using a single-crystal semiconductor layer over a first substrate, wherein an insulating layer is located between the single-crystal semiconductor layer and the first substrate;
   attaching the first substrate and a second substrate with the semiconductor element therebetween; and
   separating the first substrate from the second substrate at a separation face located between the insulating layer and the first substrate such that the semiconductor element is left over the second substrate.

10. The method for manufacturing a device according to claim 9,
    wherein a separation layer is located between the first substrate and the insulating layer, and wherein the separation layer comprises one material selected from the group consisting of tungsten, molybdenum, titanium, tantalum, niobium, nickel, cobalt, zirconium, zinc, ruthenium, rhodium, palladium, osmium and iridium.

11. The method for manufacturing a device according to claim 9, wherein the insulating layer is silicon oxide formed by a chemical vapor deposition using an organic silane.

12. The method for manufacturing a device according to claim 9, wherein the second substrate is flexible.

13. The method for manufacturing a device according to claim 9, wherein the single-crystal semiconductor layer is a single-crystal layer of one selected from the group consisting of silicon, germanium, silicon germanium, gallium arsenide and indium phosphide.

14. The method for manufacturing a device according to claim 9, wherein the attaching is conducted by thermal pressure bonding.

15. The method for manufacturing a device according to claim 10, wherein a groove is formed from the second substrate to the separation layer.

* * * * *